United States Patent
Huang et al.

(10) Patent No.: US 10,756,037 B2
(45) Date of Patent: Aug. 25, 2020

(54) PACKAGE STRUCTURE AND FABRICATING METHOD THEREOF

(71) Applicant: Taiwan Semiconductor Manufacturing Co., Ltd., Hsinchu (TW)

(72) Inventors: Li-Hsien Huang, Hsinchu County (TW); An-Jhih Su, Taoyuan (TW); Der-Chyang Yeh, Hsinchu (TW); Hua-Wei Tseng, New Taipei (TW); Yueh-Ting Lin, Taipei (TW); Ming-Shih Yeh, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/980,662

(22) Filed: May 15, 2018

(65) Prior Publication Data

US 2019/0355687 A1    Nov. 21, 2019

(51) Int. Cl.
*H01L 23/00* (2006.01)
*H01L 23/31* (2006.01)
(Continued)

(52) U.S. Cl.
CPC .............. *H01L 24/09* (2013.01); *H01L 21/56* (2013.01); *H01L 22/32* (2013.01);
(Continued)

(58) Field of Classification Search
CPC ....... H01L 24/09; H01L 21/56; H01L 23/585; H01L 23/3107; H01L 22/32; H01L 2224/02331; H01L 2224/0231; H01L 24/03; H01L 24/06; H01L 24/17; H01L 24/97; H01L 24/05; H01L 24/13; H01L 24/16; H01L 24/19; H01L 24/80; H01L 24/81; H01L 24/92; H01L 24/14; H01L 23/3128; H01L 23/49816; H01L 23/49827; H01L 23/5226; H01L 23/535;
(Continued)

(56) References Cited

U.S. PATENT DOCUMENTS 3,770,874 A * 11/1973 Krieger .................... H01L 24/81
                                                                174/257
7,285,867 B2 * 10/2007 Matsuzaki .............. H01L 21/56
                                                                257/787
(Continued)

*Primary Examiner* — Natalia A Gondarenko
(74) *Attorney, Agent, or Firm* — JCIPRNET

(57) ABSTRACT

A package structure including a semiconductor die, an insulating encapsulant, a redistribution layer and a plurality of conductive terminals is provided. The semiconductor die includes a semiconductor substrate, a plurality of conductive pads and a plurality of conductive strips. The conductive pads are disposed on and connected to the plurality of conductive pads, wherein each of the conductive strips is physically connected to at least two conductive pads. The insulating encapsulant is encapsulating the semiconductor die. The redistribution layer is disposed on the insulating encapsulant and the semiconductor die, wherein the redistribution layer is electrically connected to the plurality of conductive strips. The plurality of conductive terminals is disposed on the redistribution layer.

20 Claims, 28 Drawing Sheets

(51) Int. Cl.
*H01L 23/58* (2006.01)
*H01L 21/56* (2006.01)
*H01L 21/66* (2006.01)

(52) U.S. Cl.
CPC ........ *H01L 23/3107* (2013.01); *H01L 23/585* (2013.01); *H01L 2224/0231* (2013.01); *H01L 2224/02331* (2013.01)

(58) Field of Classification Search
CPC .............. H01L 23/528; H01L 23/5384; H01L 23/5386; H01L 23/562; H01L 25/0652; H01L 25/0657; H01L 2924/3512; H01L 2924/3511; H01L 2924/35121; H01L 2924/384; H01L 2933/0033; H01L 2224/0215; H01L 2224/06–06149; H01L 2224/07; H01L 2224/08–0807; H01L 2224/081–08121; H01L 2224/10–10156; H01L 2224/15; H01L 2224/16–16148; H01L 2224/16188; H01L 2224/16257; H01L 2224/16268; H01L 2224/1483; H01L 2224/13084; H01L 2224/0903–09055; H01L 2224/244; H01L 2224/29006; H01L 2224/29015; H01L 2224/29021–29027; H01L 2224/29075–29084; H01L 2224/0558; H01L 2224/14104; H01L 2224/05027; H01L 2224/131; H01L 2224/13083; H01L 2224/13027; H01L 2224/13014; H01L 2224/13013; H01L 2224/13007; H01L 2224/05647; H01L 2224/05559; H01L 2224/05022

USPC .................................. 257/684, 737, 738, 786
See application file for complete search history.

(56) References Cited

U.S. PATENT DOCUMENTS

| | | | |
|---|---|---|---|
| 8,896,094 B2* | 11/2014 | Yen ........................ | H01L 28/10 257/531 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2002/0104874 A1* | 8/2002 | Byun ................ | H01L 23/49816 228/180.22 |
| 2007/0278681 A1* | 12/2007 | Yu ..................... | H01L 21/76807 257/758 |
| 2012/0091584 A1* | 4/2012 | Kim ........................ | H01L 24/05 257/738 |
| 2014/0252646 A1* | 9/2014 | Hung .................... | H01L 23/481 257/774 |
| 2017/0005035 A1* | 1/2017 | Chen .................... | H01L 23/3171 |
| 2017/0062360 A1* | 3/2017 | Chang ................. | H01L 23/3121 |

* cited by examiner

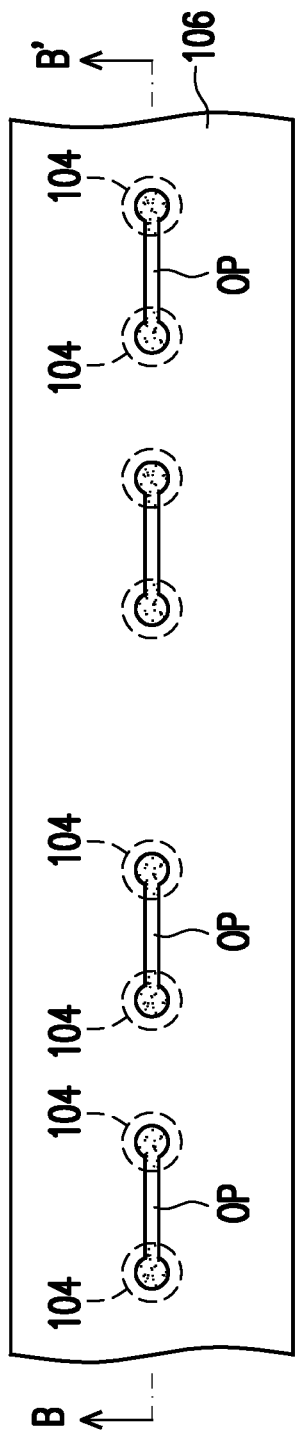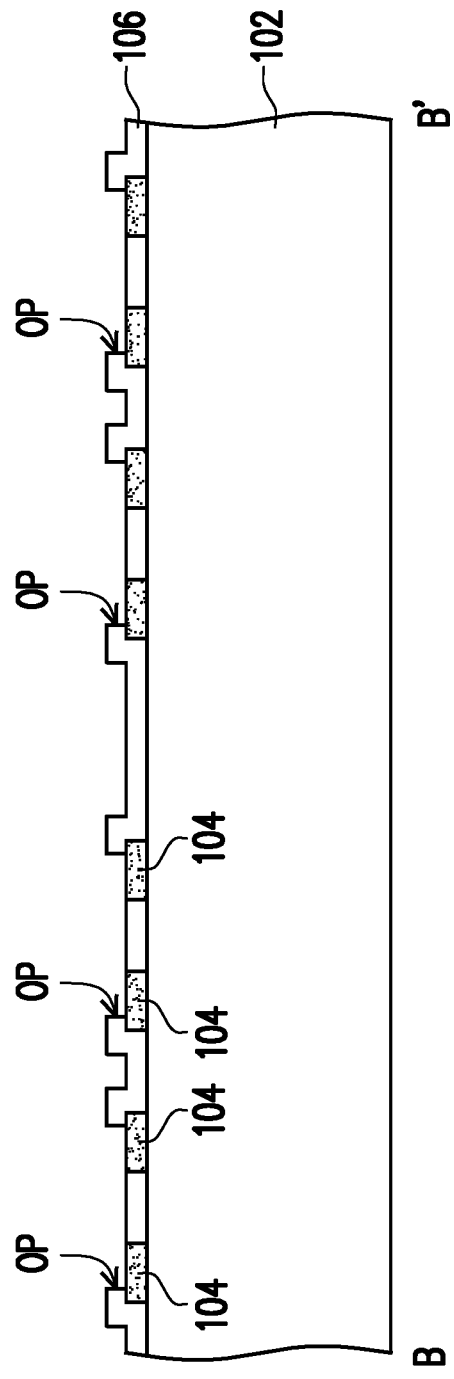
FIG. 2A
FIG. 2B

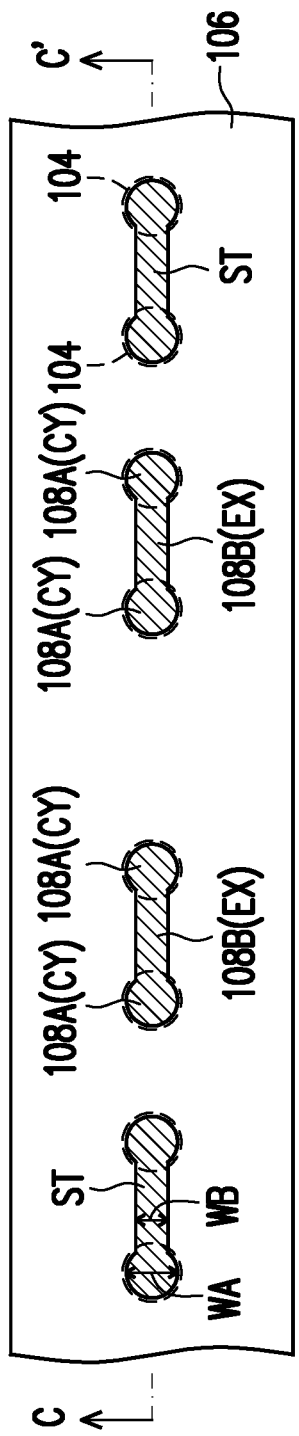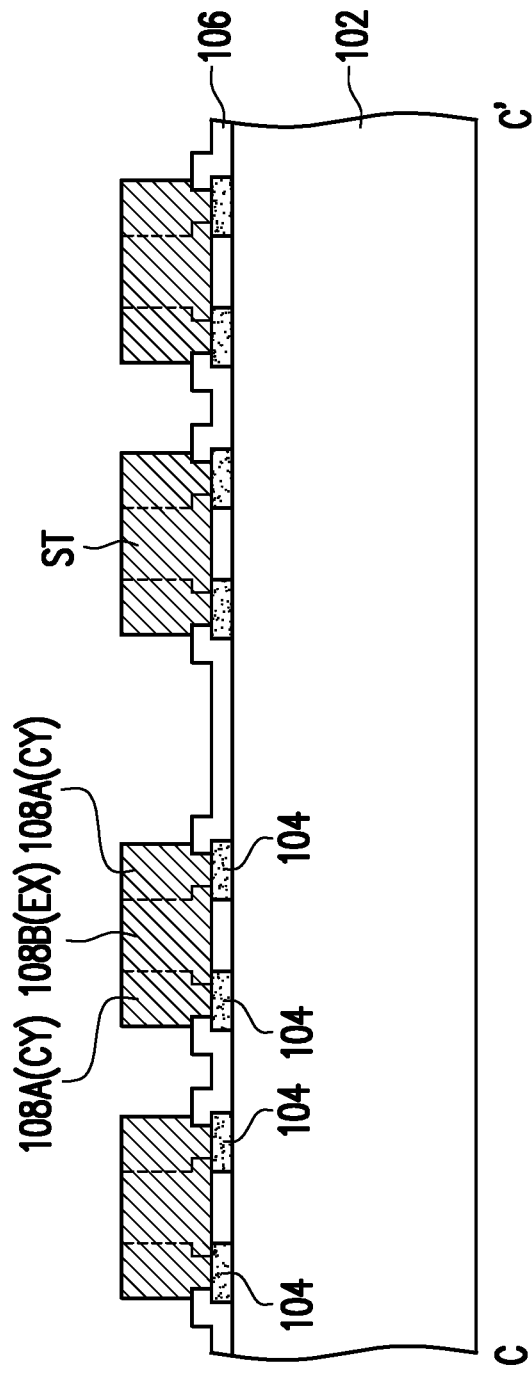
FIG. 3A
FIG. 3B

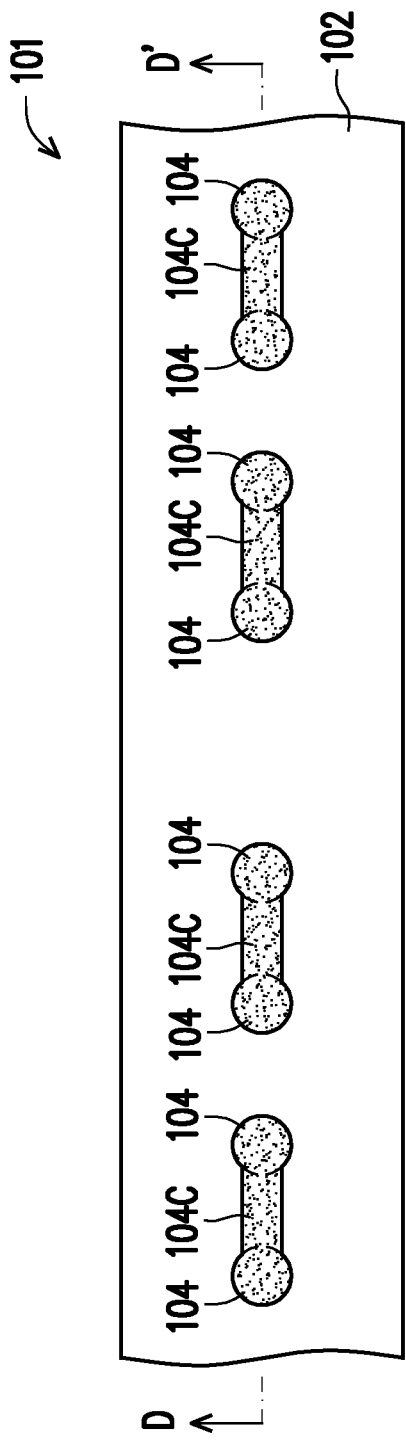
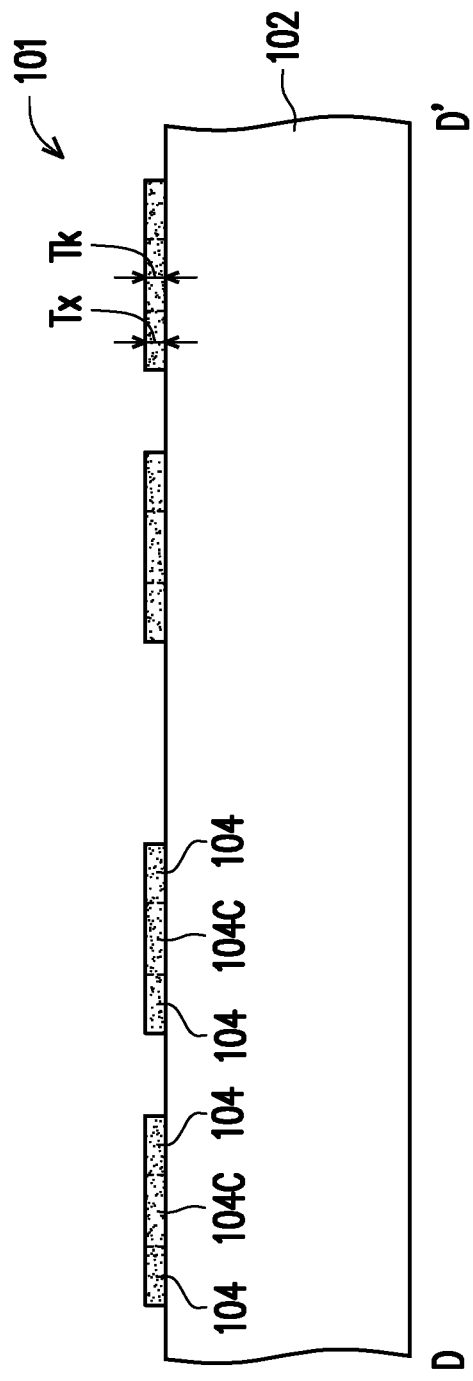

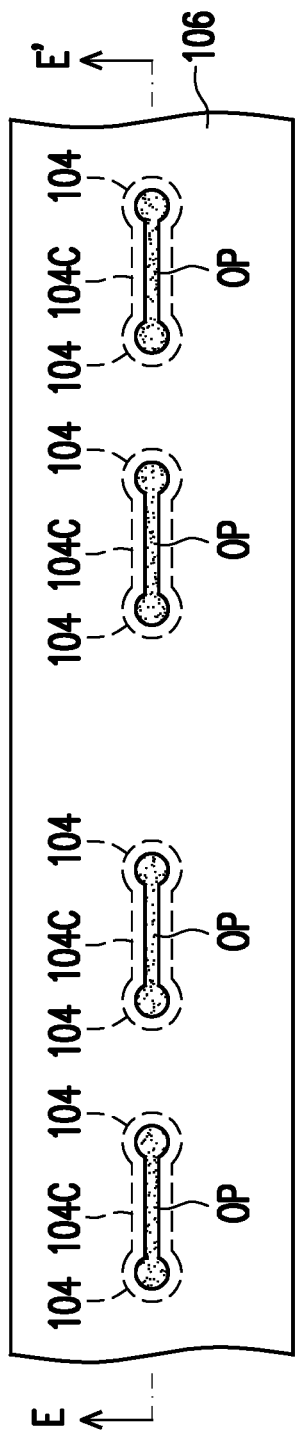
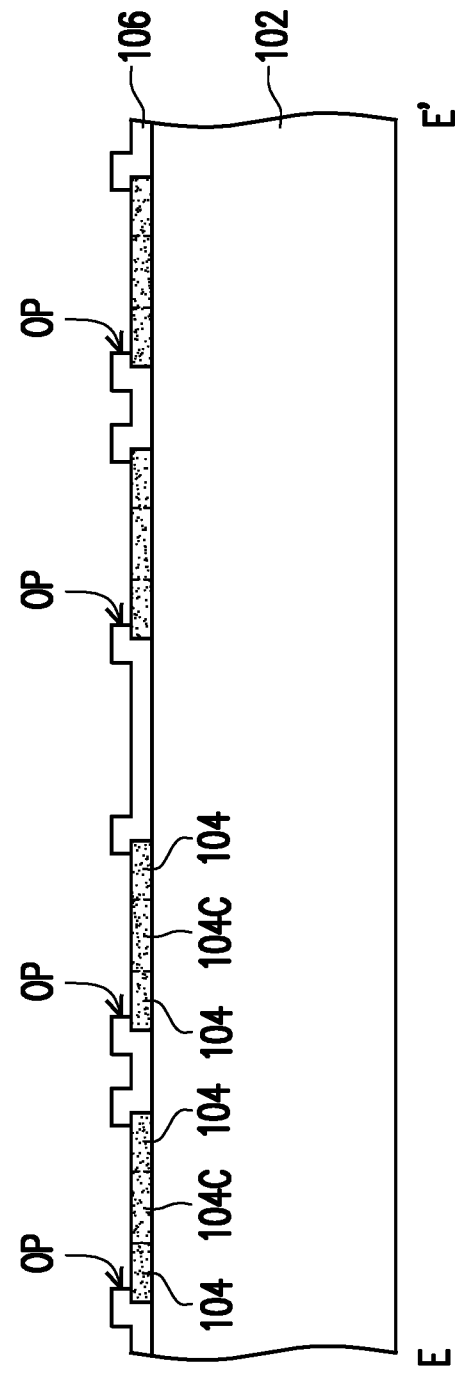
FIG. 7A
FIG. 7B

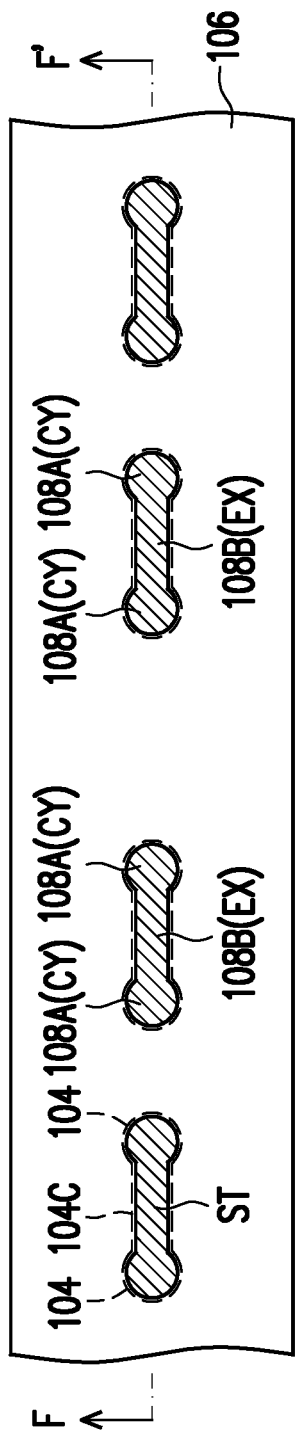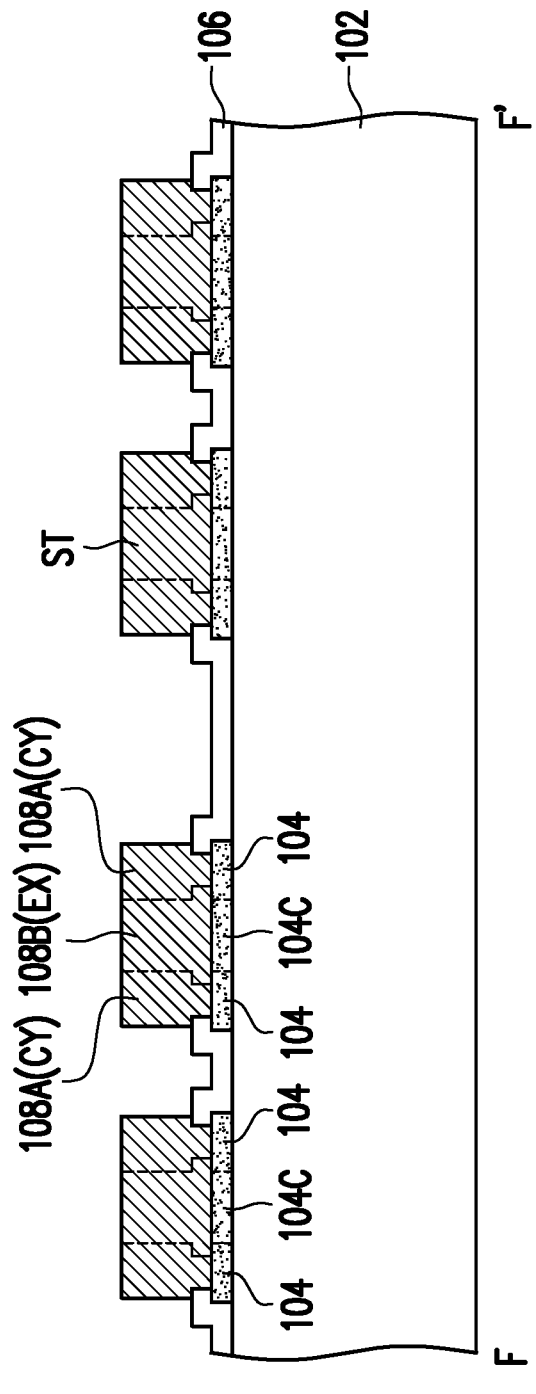
FIG. 8A
FIG. 8B

US 10,756,037 B2

PACKAGE STRUCTURE AND FABRICATING METHOD THEREOF

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 5 are schematic views of various stages in a manufacturing method of a semiconductor die according to some exemplary embodiments of the present disclosure.

FIG. 6A to FIG. 10 are schematic views of various stages in a manufacturing method of a semiconductor die according to another exemplary embodiment of the present disclosure.

DETAILED DESCRIPTION

Figure 1A:
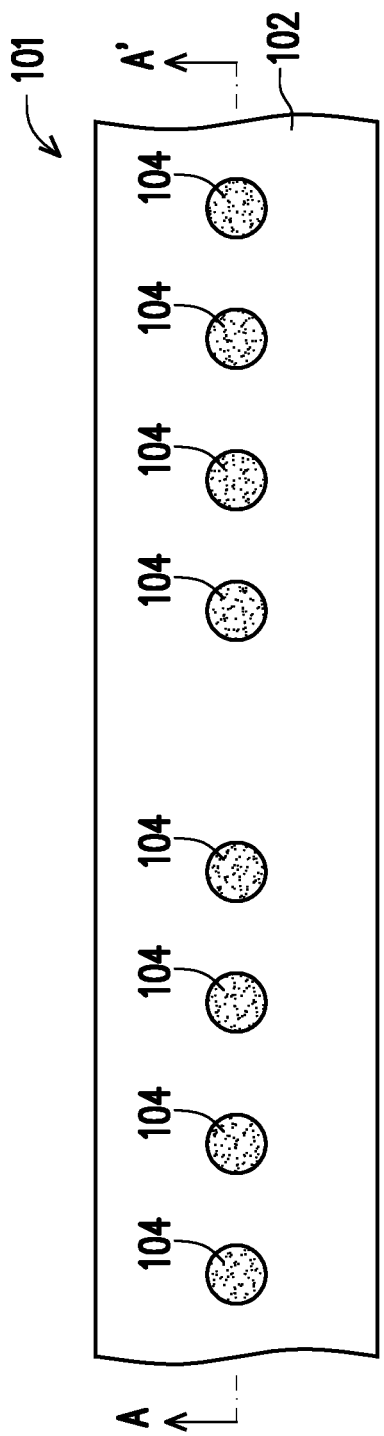

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 5 are schematic views of various stages in a manufacturing method of a semiconductor die according to some exemplary embodiments of the present disclosure.

Figure 1B:
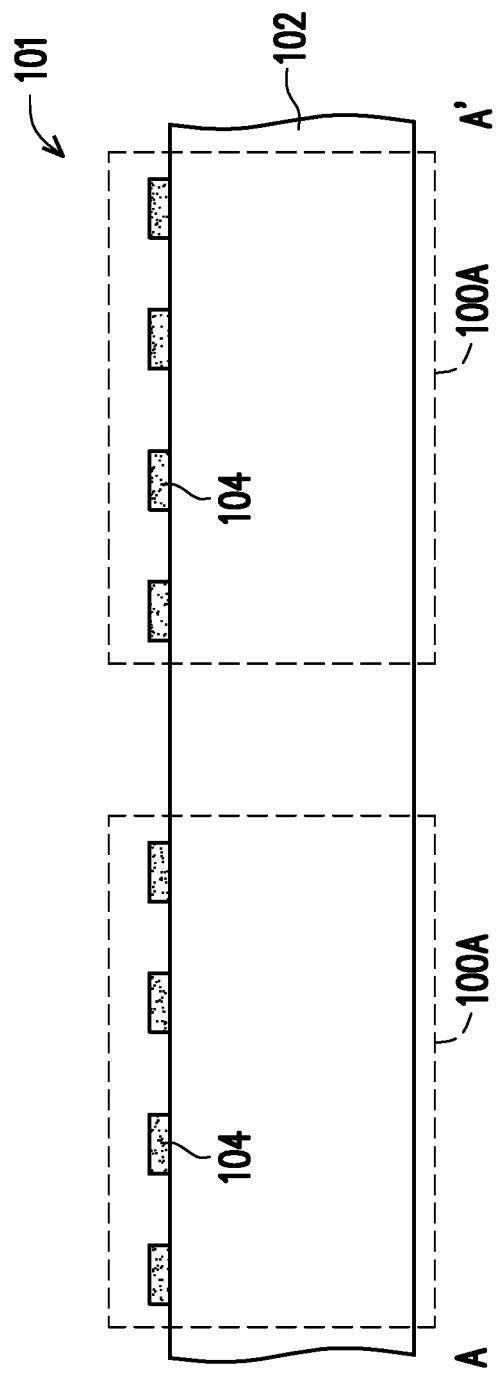

FIG. 1A is a top view of a stage of manufacturing a semiconductor die, while FIG. 1B is a cross-sectional view of the structure shown in FIG. 1A taken along the line A-A'. As shown in FIG. 1A and FIG. 1B, a semiconductor wafer 101 including a plurality of integrated circuit component or semiconductor dies 100A is provided. Before performing a wafer dicing process on the semiconductor wafer 101, the semiconductor dies 100A of the semiconductor wafer 101 are physically connected to one another. In some embodiments, the semiconductor wafer 101 includes a semiconductor substrate 102, and a plurality of conductive pads 104 formed on the semiconductor substrate 102. In some embodiments, the plurality of conductive pads 104 is formed by the following steps. For example, a first conductive material (not shown) is formed on the semiconductor substrate 102; the first conductive material is patterned using a photolithography and/or etching process to form a plurality of conductive pads 104 on the semiconductor substrate 102. Each of the conductive pads 104 are separated from one another. For illustrative purposes, only four conductive pads 104 are shown in each of the semiconductor dies 100A. However, it should be noted that the number of conductive pads 104 on each of the semiconductor dies 100A is not limited to four, and this can be adjusted based on design requirements.

In some embodiments, the semiconductor substrate 102 may be a bulk silicon substrate or a silicon-on-insulator (SOI) substrate, and further includes active components (e.g., transistors or the like) and optionally passive components (e.g., resistors, capacitors, inductors or the like) formed therein. In certain embodiments, the conductive pads 104 may be aluminum pads, copper pads or other suitable metal pads. Furthermore, as illustrated in FIG. 1A and FIG. 1B, the conductive pads 104 may have a circular shape, however, the disclosure is not limited thereto. In some other embodiments, the conductive pads 104 may have an octagonal shape, or any other shapes based on design requirements.

FIG. 2A is a top view of a next stage of manufacturing the semiconductor die, while FIG. 2B is a cross-sectional view of the structure shown in FIG. 2A taken along the line B-B'. As shown in FIG. 2A and FIG. 2B, a passivation layer 106 is formed over the substrate 102 and on the plurality of conductive pads 104. The passivation layer 106 is patterned to form a plurality of contact openings OP, wherein the conductive pads 104 are partially exposed by the contact openings OP. In some embodiments, portions of at least two of the conductive pads 104 are exposed by each of the contact openings OP. In certain embodiments, the passivation layer 106 may be a silicon oxide layer, a silicon nitride layer, a silicon oxy-nitride layer or a dielectric layer formed of any suitable dielectric materials.

FIG. 3A is a top view of a next stage of manufacturing the semiconductor die, while FIG. 3B is a cross-sectional view of the structure shown in FIG. 3A taken along the line C-C'. As shown in FIG. 3A and FIG. 3B, a plurality of conductive strips ST is formed within the contact openings OP, and on the plurality of conductive pads 104. In some embodiments, each of the conductive strips ST are formed with at least two conductive posts 108A and a first connecting structure 108B physically connecting the two conductive posts 108A together. In some other embodiments, more than two conductive posts 108A are joined together by the first connecting structure 108B. In such embodiment, the number of conductive posts 108A that are connected together may correspond to the number of conductive pads 104 located below. In some alternative embodiments, the first connecting structure 108B physically connects all of the plurality of conductive posts 108A together. In some embodiments, an outline of the conductive posts 108A may substantially correspond to an outline of the conductive pads 104. In other words, when the conductive pads 104 have a circular shape (from top view), the conductive posts 108A may have a cylindrical profile, however, the disclosure is not limited thereto, and the design of the conductive posts 108A may be adjusted based on design requirement. In certain embodiments, a width WA of the conductive posts 108A is larger than a width WB of the first connecting structure 108B. However, the disclosure is not limited thereto. In some other embodiments, the width WA of the conductive posts 108A may be smaller than or equal to the width WB of the first connecting structure 108B.

In the illustrated embodiment, each of the conductive strips ST is physically connected to at least two conductive pads 104. For example, each conductive post 108A may be connected to a corresponding conductive pad 104, while the first connecting structure 108B physically connects the two conductive posts 108A together and physically connects to the two conductive pads 104 located below. In some embodiments, a height H1 of the first connecting structure 108B is equal to a height H2 of the plurality of conductive posts 108A. In certain embodiments, the conductive strips ST may be viewed as having a plurality of cylindrical portions CY and an extending portion EX that physically connect the cylindrical portions CY together. In other words, the cylindrical portions CY have a cylindrical profile, while the extending portion EX extends from one cylindrical portion CY to another cylindrical portion CY. In certain embodiments, the cylindrical portions CY corresponds to the plurality of conductive posts 108A, and the extending portion EX corresponds to the first connecting structure 108B.

Figure 4:
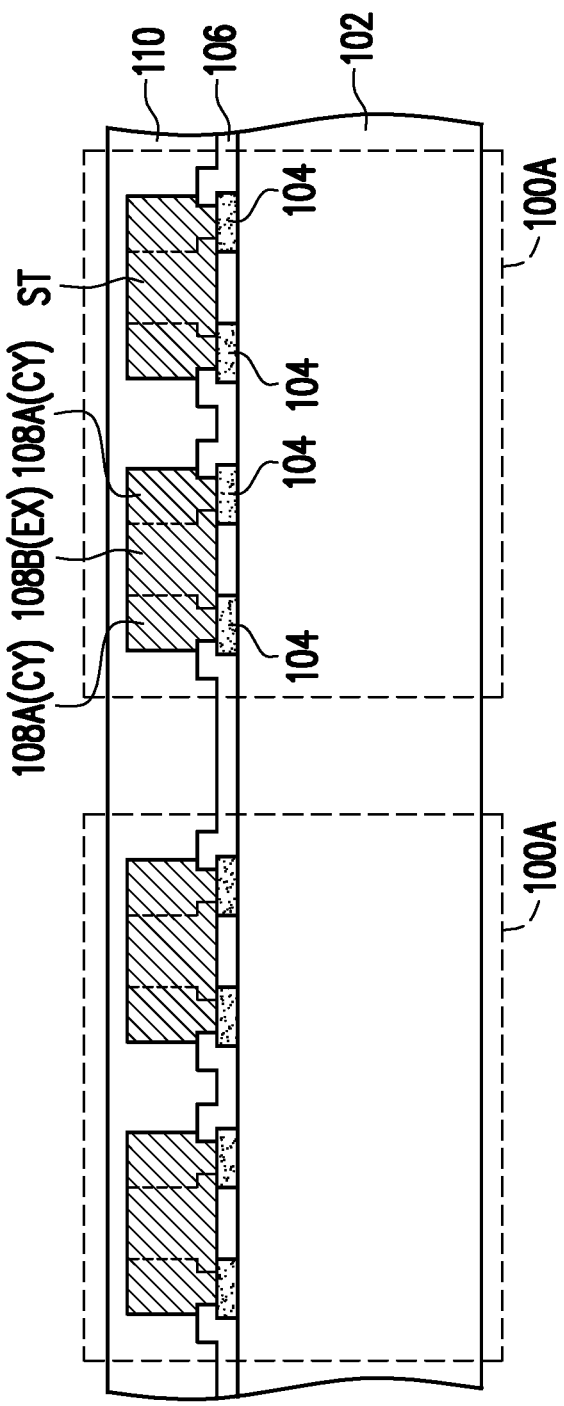

FIG. 4 is a cross-sectional view of a next stage of manufacturing the semiconductor die. Referring to FIG. 4, after forming the conductive posts 108A and the first connecting structure 108B, a protection layer 110 is formed on the passivation layer 106 and over the conductive strips ST. In other words, the conductive posts 108A and the first connecting structure 108B are covered by the protection layer 110. In some embodiments, the protection layer 110 may be a polymer layer having sufficient thickness to encapsulate and protect the conductive strips ST. In some embodiments, the protection layer 110 may be a polybenzoxazole (PBO) layer, a polyimide (PI) layer or other suitable polymer layer. In certain embodiments, the protection layer 110 may be a polyimide layer formed by a low temperature process (low temperature polyimide). In some alternative embodiments, the protection layer 110 may be made of inorganic materials. As shown in FIG. 4, the protection layer 110 has a substantially planar top surface and a maximum thickness of the protection layer 110 is greater than a height (H1/H2) of the conductive strips ST.

Figure 5:
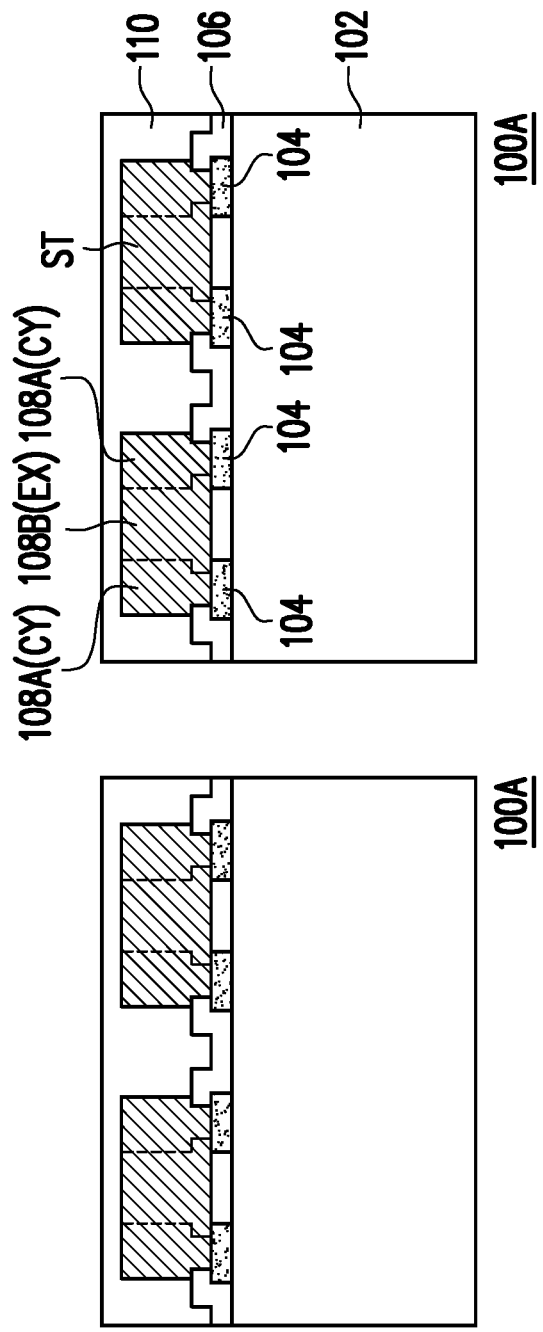

FIG. 5 is a cross-sectional view of a next stage of manufacturing the semiconductor die. Referring to FIG. 5, after forming the protection layer 110, a backside grinding process may be optionally performed on the back surface of the semiconductor wafer 101. For example, the semiconductor substrate 102 may be partially grinded by a mechanical grinding process or other suitable grinding or polishing processes. Subsequently, wafer dicing process is performed on the semiconductor wafer 101 to cut the semiconductor wafer 101 into a plurality of semiconductor die 100A. Each one of the singulated semiconductor die 100A may include the semiconductor substrate 102, the conductive pads 104 formed on the semiconductor substrate 102, the passivation layer 106 formed over the conductive pads 104, conductive strips ST disposed on the conductive pads 104, and the protection layer 110 covering the conductive strips ST.

FIG. 6A to FIG. 10 are schematic views of various stages in a manufacturing method of a semiconductor die according to another exemplary embodiment of the present disclosure. The embodiment shown in FIG. 6A to FIG. 10 is similar to the embodiment shown in FIG. 1A to FIG. 5. Hence, the same reference numerals are referred to the same or liked parts, and its detailed description will be omitted herein. The difference between the embodiment shown in FIG. 6A to FIG. 10 and the embodiment shown in FIG. 1A to FIG. 5 is that a second connecting structure is further provided.

FIG. 6A is a top view of a stage of manufacturing a semiconductor die, while FIG. 6B is a cross-sectional view of the structure shown in FIG. 6A taken along the line D-D'. As shown in FIG. 6A and FIG. 6B, a semiconductor wafer 101 including a plurality of integrated circuit component or semiconductor dies 100B is provided. In some embodiments, the semiconductor wafer 101 includes a semiconductor substrate 102, a plurality of conductive pads 104 formed on the semiconductor substrate 102 and a second connecting structure 104C physically connecting at least two of the conductive pads 104 together. In some other embodiments, the second connecting structure 104C may physically connect all of the plurality of conductive pads 104 together. In certain embodiments, a thickness TK of the second connecting structure 104C is equal to a thickness Tx of the conductive pads 104. In some embodiments, a width WC of the conductive pads 104 is larger than a width WD of the second connecting structure 104C. However, the disclosure is not limited thereto. In some other embodiments, the width WC of the conductive pads 104 may be smaller than or equal to the width WD of the second connecting structure 104C. In some embodiments, the plurality of conductive pads 104 and the second connecting structure 104C are formed by the following steps. For example, a first conductive material (not shown) is formed on the semiconductor substrate 102; the first conductive material is patterned using a photolithography and/or etching process to form the plurality of conductive pads 104 and the second connecting structure 104C on the semiconductor substrate 102. In other words, the conductive pads 104 and the second connecting structure 104C may be defined using the same processing steps.

FIG. 7A is a top view of a next stage of manufacturing the semiconductor die, while FIG. 7B is a cross-sectional view of the structure shown in FIG. 7A taken along the line E-E'. As shown in FIG. 7A and FIG. 7B, a passivation layer 106 is formed over the substrate 102 and on the plurality of conductive pads 104. The passivation layer 106 is patterned to form a plurality of contact openings OP, wherein the conductive pads 104 and the second connecting structure 104C are exposed by the contact openings OP.

FIG. 8A is a top view of a next stage of manufacturing the semiconductor die, while FIG. 8B is a cross-sectional view of the structure shown in FIG. 8A taken along the line F-F'. As shown in FIG. 8A and FIG. 8B, after forming the passivation layer 106, a plurality of conductive strips ST is formed within the contact openings OP, and on the plurality of conductive pads 104 and the second connecting structure 104C. The conductive strips ST described in the current embodiment is similar to the conductive strips ST described in FIG. 3A and FIG. 3B, hence its detailed description is omitted herein. The difference is that the conductive strips ST of FIG. 8A and FIG. 8B are physically connected to the conductive pads 104 and the second connecting structure 104C located below. For example, in some embodiments, the first connecting structure 108B is physically connected to the second connecting structure 104C.

Figure 9:
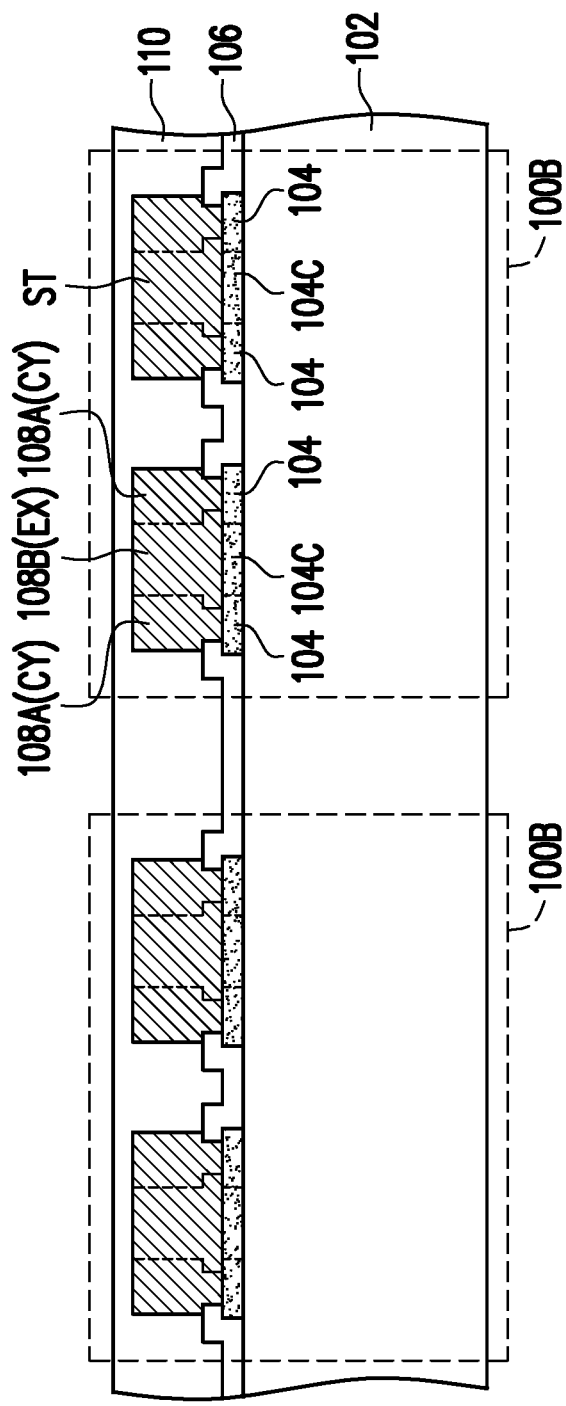
Figure 10:
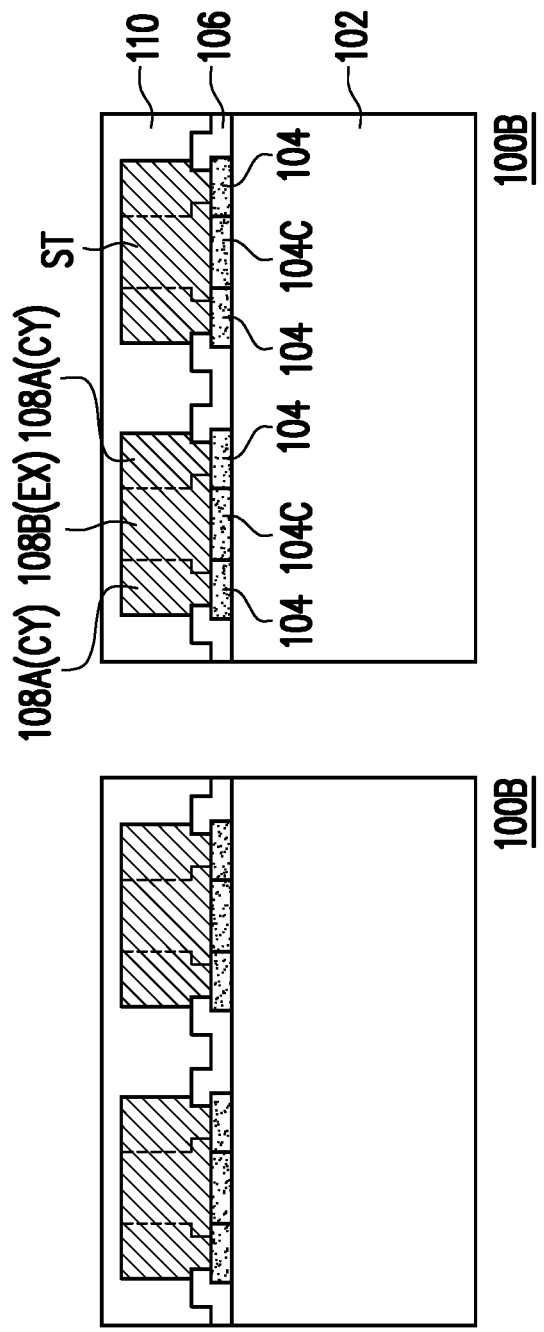

Referring to FIG. 9, after forming the conductive strips ST, a protection layer 110 is formed on the passivation layer 106 and over the conductive strips ST. Subsequently, referring to FIG. 10, a wafer dicing process is performed on the semiconductor wafer 101 to cut the semiconductor wafer 101 into a plurality of semiconductor dies 100B. Each one of the singulated semiconductor die 100B may include the semiconductor substrate 102, the conductive pads 104 formed on the semiconductor substrate 102, the second connecting structure 104C physically connecting the conductive pads 104, the passivation layer 106 formed over the conductive pads 104, conductive strips ST disposed on the conductive pads 104 and the second connecting structure 104C, and the protection layer 110 covering the conductive strips ST.

In the above embodiments, the first connecting structure 108B is physically connecting two of the conductive posts 108A together, and the second connecting structure 104C is physically connecting two of the conductive pads 104 together. However, the disclosure is not limited thereto. In some other embodiments, the first connecting structure 108B is physically connecting more than two conductive posts 108A together, and the conductive posts 108A may be connected in a variety of different ways. Similarly, the second connecting structure 104C is physically connecting more than two conductive pads 104 together, and the conductive pads 104 may be connected in a variety of different ways. In the following embodiments, examples of connecting the conductive posts 108A and the conductive pads 104 will be described in detail.

Figure 11A:
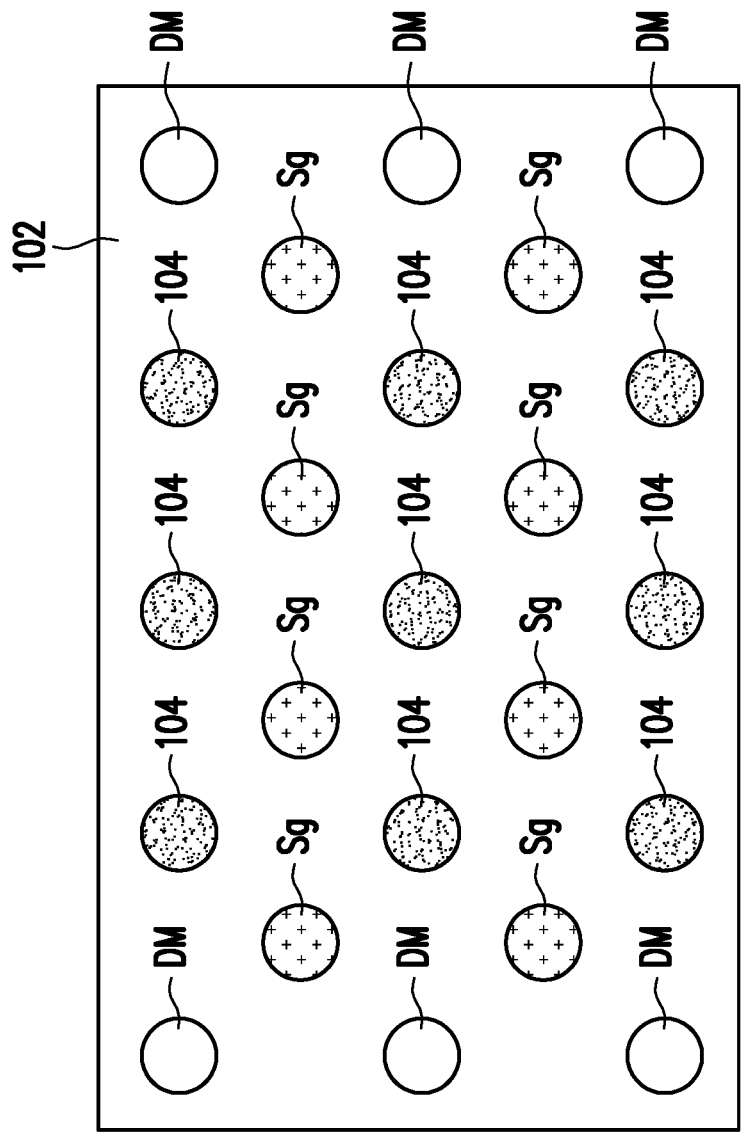
FIG. 11A is a schematic top view of a semiconductor die according to some exemplary embodiments of the present disclosure.

Referring to FIG. 11A, a top view of a portion of the semiconductor die 100A after forming the conductive pads 104 is shown. In some embodiments, besides forming conductive pads 104, a plurality of signal pads Sg and a plurality of dummy pads DM may be formed adjacent to the conductive pads 104. For example, the signal pads Sg may have electrical connection with a signal conductor, whereas the dummy pads DM do not have electrical connection with other components. In certain embodiments, the conductive pads 104 may be power pads or ground pads having electrical connection with a power conductive structure or a ground conductive structure. In certain embodiments, the plurality of dummy pads DM is not connected to the conductive posts 108A and the first connecting structure 108B formed in the subsequent steps.

Figure 11B:
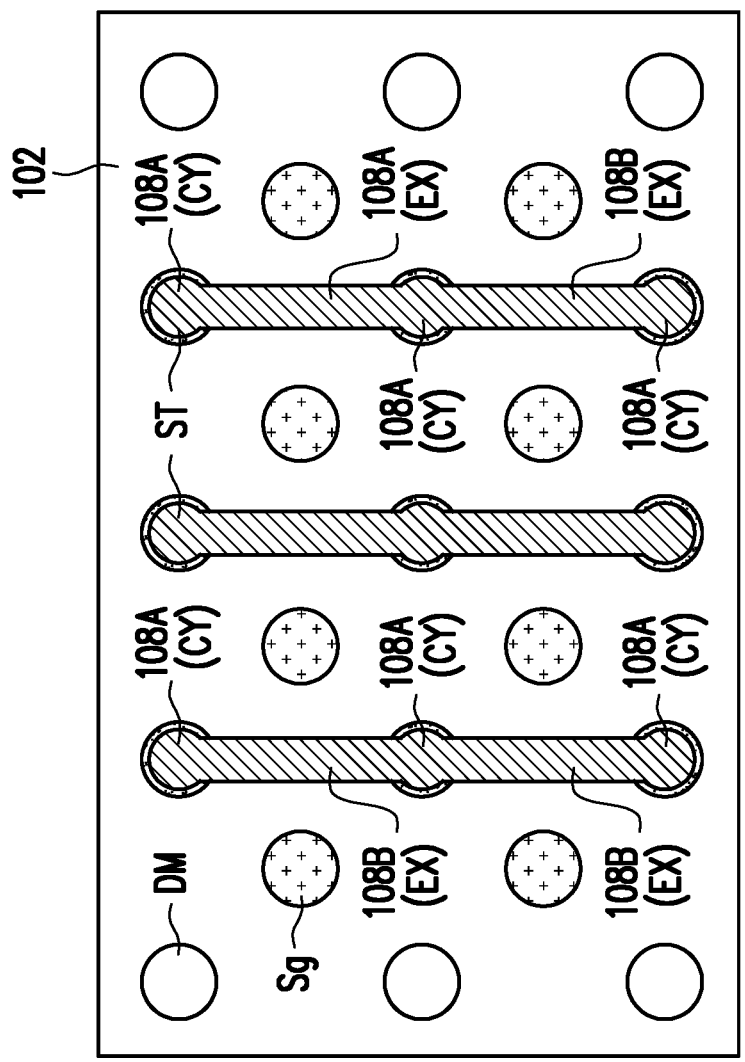
FIG. 11B is a schematic top view of a semiconductor die according to some exemplary embodiments of the present disclosure.

Referring to FIG. 11B, a top view of a portion of the semiconductor die 100A after forming the plurality of conductive strips ST is shown. As illustrated in FIG. 11B, each of the conductive posts 108A is disposed on a corresponding conductive pad 104, and the first connecting structure 108B is connecting three conductive posts 108A together. In some embodiments, one of the conductive strips ST may be parallel with another conductive strip ST, however, this construes no limitation in the disclosure. In certain embodiments, the conductive strips ST are physically connected to the conductive pads 104 located below, and not connected to the signal pads Sg or the dummy pads DM.

Figure 11C:
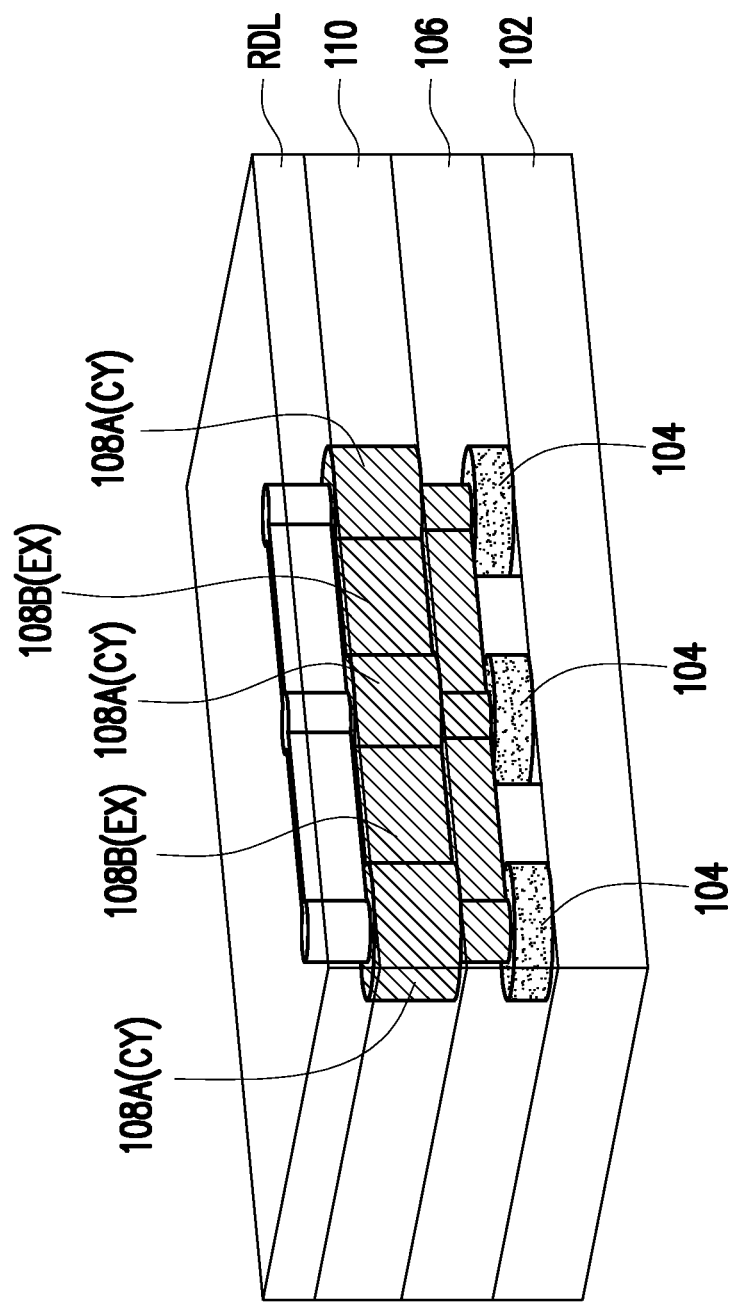
FIG. 11C is a perspective view of a portion of the semiconductor die shown in FIG. 11B.

FIG. 11C is a perspective view of a portion of the semiconductor die shown in FIG. 11B. Referring to FIG. 11C, each of the conductive posts 108A is disposed on a corresponding conductive pad 104, and the first connecting structure 108B is connecting three conductive posts 108A together. In some embodiments, the conductive pads 104 have a circular outline (from top-view), and the conductive posts 108A have a cylindrical profile, whereas the first connecting structure 108B is an extending block joining the conductive posts 108A together. However, the disclosure is not limited thereto. In some other embodiments, the conductive pads 104 may have an octahedral outline, and the conductive posts 108A and the first connecting structure 108B together may have a block-like profile. In other words, there is no clear interface between the conductive posts 108A and the first connecting structure 108B. It is noted that the design of the conductive pads 104, the conductive posts 108A and the first connecting structure 108B may be altered based on requirement.

Figure 12:
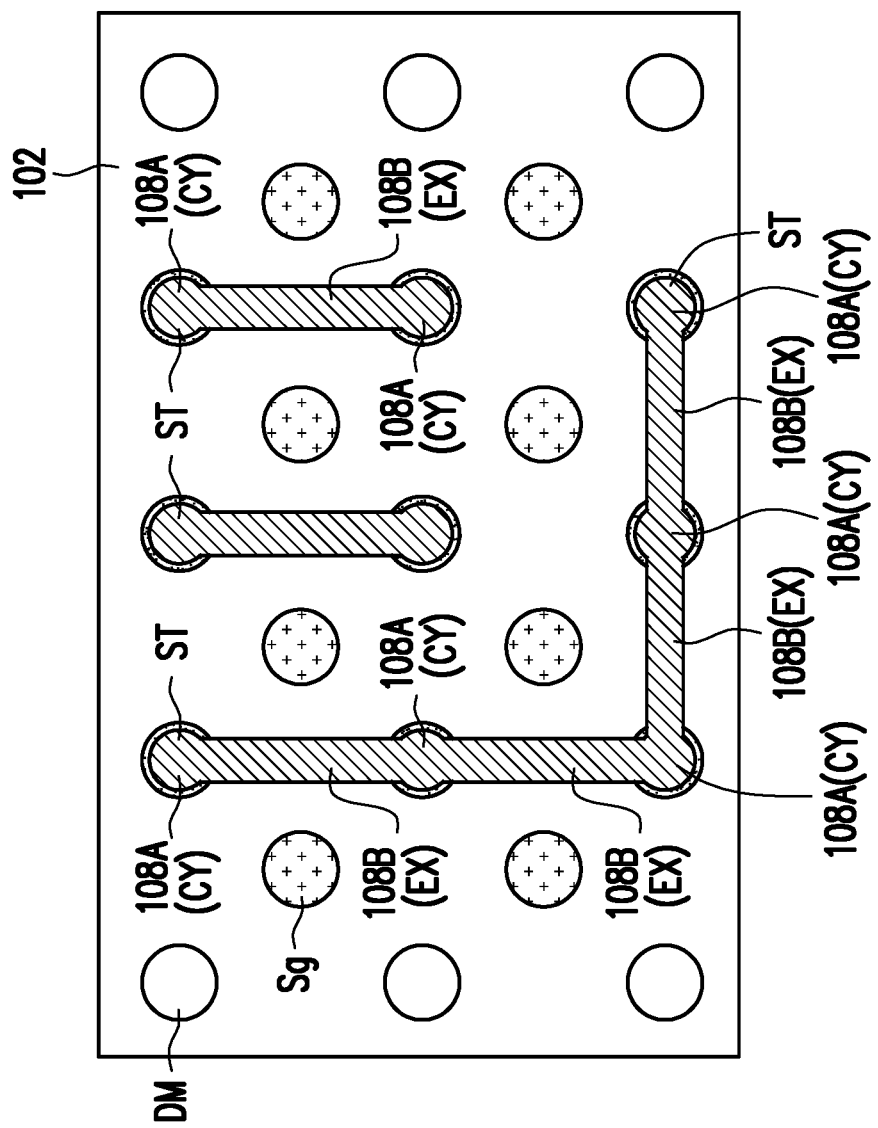
FIG. 12 is a schematic top view of a semiconductor die according to some exemplary embodiments of the present disclosure.

FIG. 12 is a schematic top view of a semiconductor die according to some exemplary embodiments of the present disclosure. Referring to FIG. 12, in some embodiments, the conductive posts 108A may be connected in different ways to give conductive strips ST having different lengths. For example, the first connecting structure 108B may physically connect five conductive posts 108A together to form a conductive strip ST having a L-shaped profile, whereas another first connecting structure 108B may be connecting two conductive posts 108A together.

Figure 13:
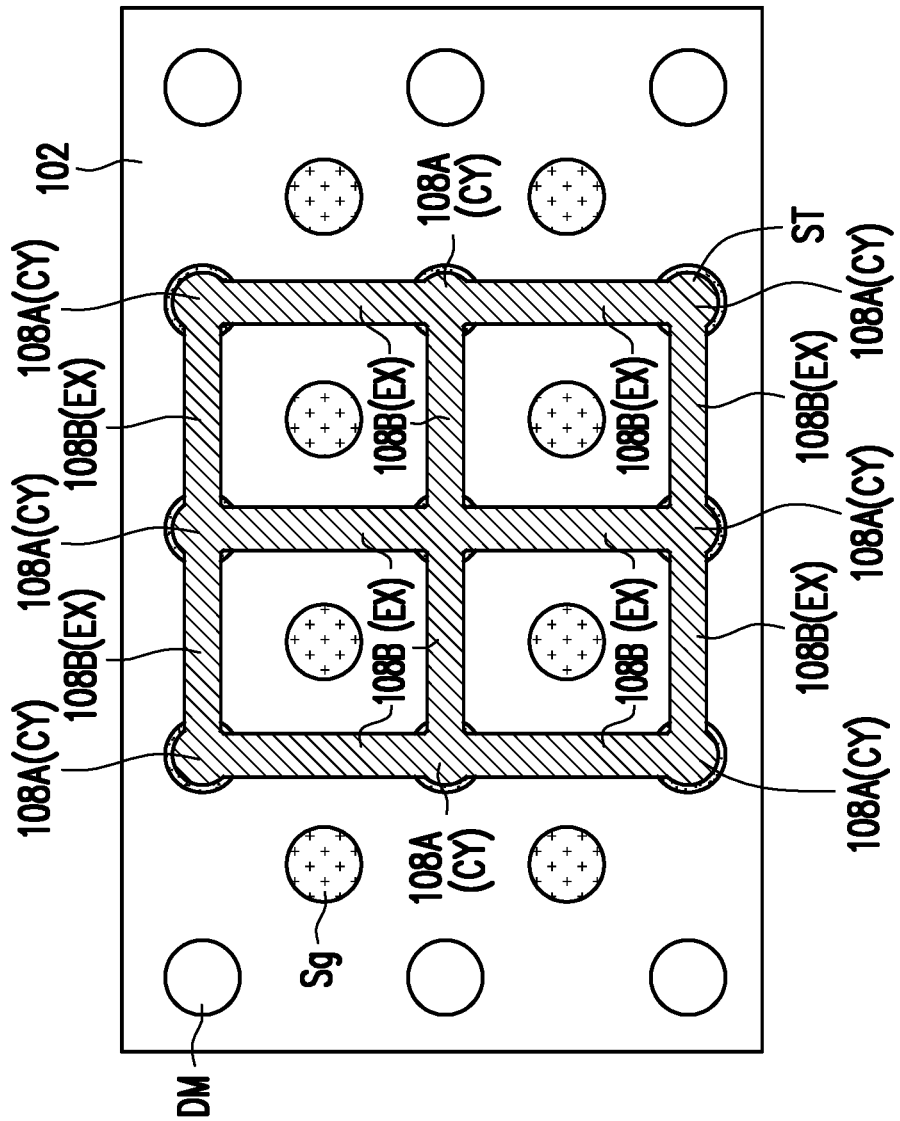
FIG. 13 is a schematic top view of a semiconductor die according to some exemplary embodiments of the present disclosure.

FIG. 13 is a schematic top view of a semiconductor die according to some exemplary embodiments of the present disclosure. Referring to FIG. 13, in some embodiments, the first connecting structure 108B may physically connect all of the conductive posts 108A together. For example, in the step of patterning the passivation layer 106 (shown in FIG. 2A and FIG. 2B), one contact opening OP exposing all of the contact pads 104 is formed. Subsequently, the conductive strips ST is filled within the contact opening OP and physically connected to the conductive pads 104. In the exemplary embodiment, the profile of the contact opening OP is not particularly limited and may depend on the profile of the conductive strips ST formed thereafter.

Figure 14A:
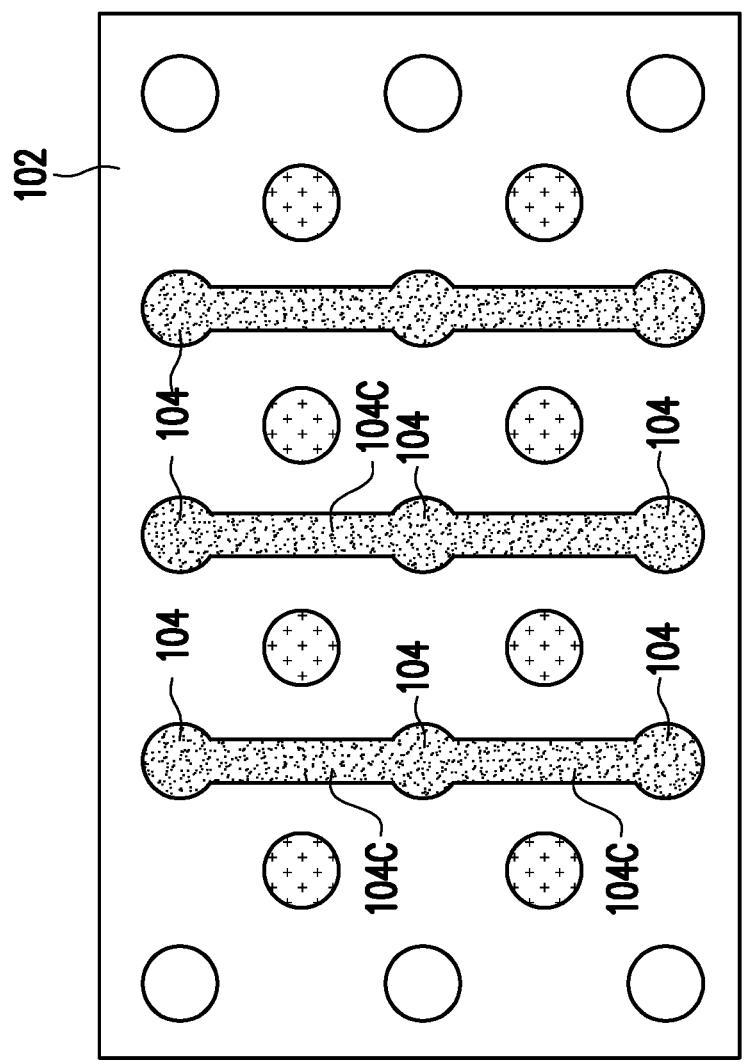
FIG. 14A is a schematic top view of a semiconductor die according to some exemplary embodiments of the present disclosure.
Figure 14B:
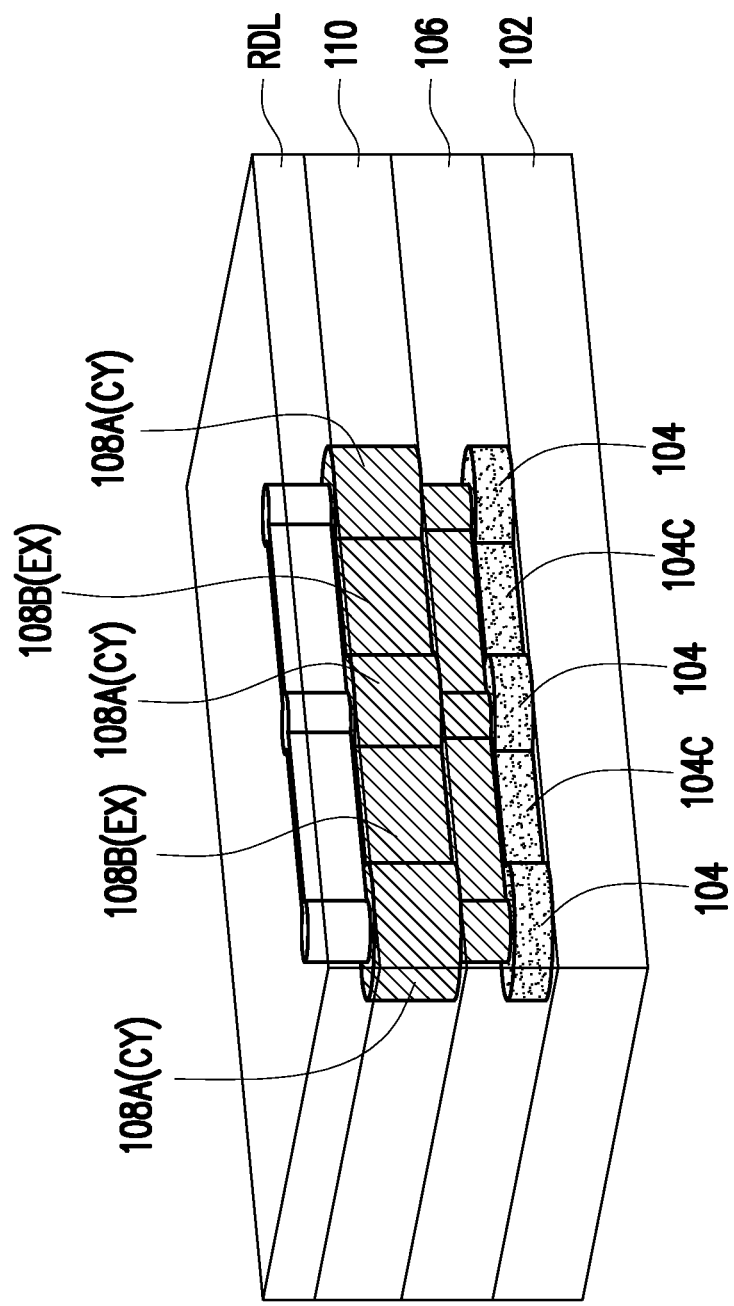
FIG. 14B is a perspective view of a portion of the semiconductor die shown in FIG. 14A.

Referring to FIG. 14A, a top view of a portion of the semiconductor die 100B after forming the conductive pads 104 and the second connecting structure 104C is shown. In the exemplary embodiment, the second connecting structure 104C is connecting three conductive pads 104 together. In some embodiments, the conductive posts 108A and the first connecting structure 108B disposed thereon have a similar profile. For example, the conductive posts 108A and the first connecting structure 108B may have a profile similar to that shown in FIG. 11B. FIG. 14B is a perspective view of a portion of the semiconductor die shown in FIG. 14A after forming the conductive strips ST. Referring to FIG. 14B, the second connecting structure 104C is connecting three conductive pads 104 together, and the first connecting structure 108B is connecting three conductive posts 108A together. Furthermore, in some embodiments, the conductive posts 108A are physically connected to the conductive pads 104, while the first connecting structure 108B is physically connected to the second connecting structure 104C.

Figure 15:
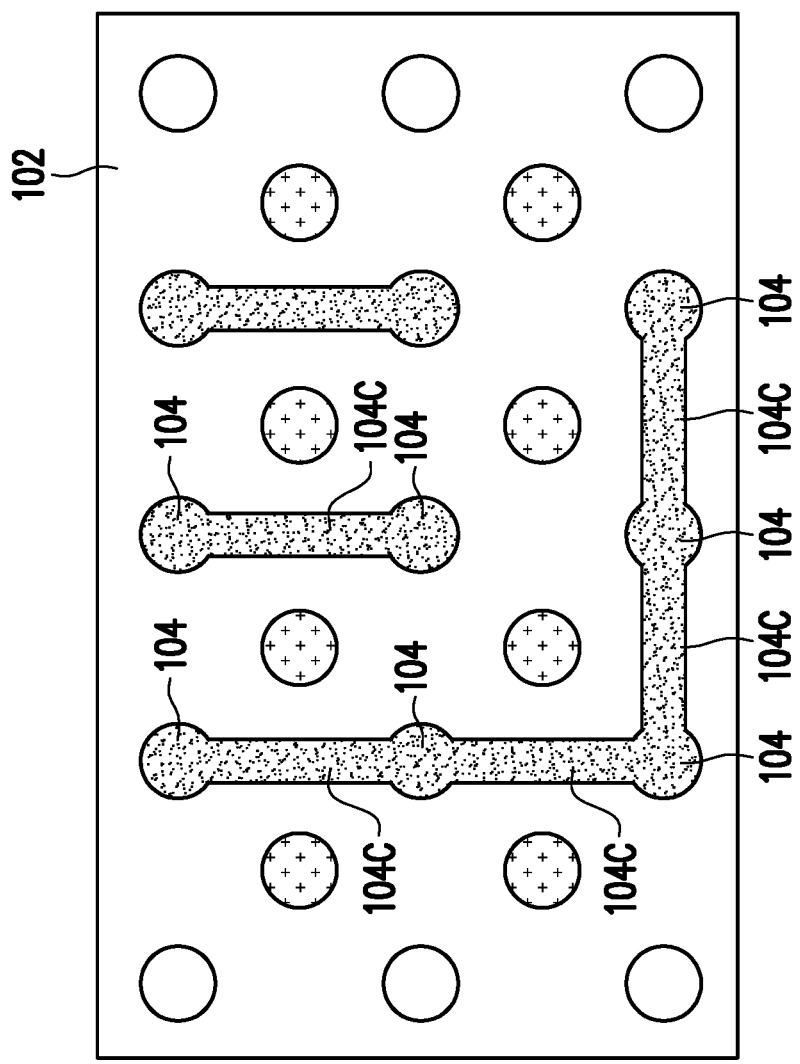
FIG. 15 is a schematic top view of a semiconductor die according to some exemplary embodiments of the present disclosure.
Figure 16:
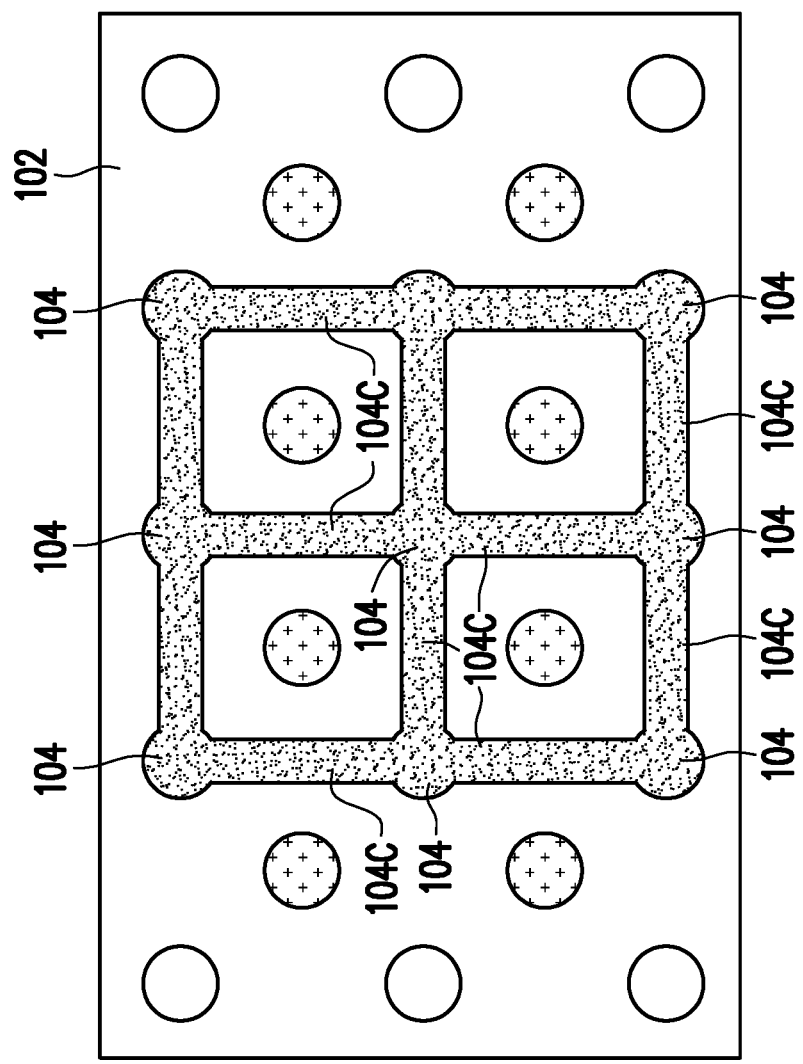
FIG. 16 is a schematic top view of a semiconductor die according to some exemplary embodiments of the present disclosure.

FIG. 15 is a schematic top view of a semiconductor die according to some exemplary embodiments of the present disclosure. Referring to FIG. 15, in some embodiments, the conductive pads 104 may be connected in different ways. For example, a second connecting structure 104C may physically connect five conductive pads 104 together, whereas another second connecting structure 104 may physically connect two conductive pads 104 together. FIG. 16 is a schematic top view of a semiconductor die according to some exemplary embodiments of the present disclosure. Referring to FIG. 16, in some embodiments, the second connecting structure 104C may physically connect all of the conductive pads 104 together. For example, the first conductive material may be patterned in a way such that all the conductive pads 104 are connected through the second connecting structure 104C.

Figure 17:
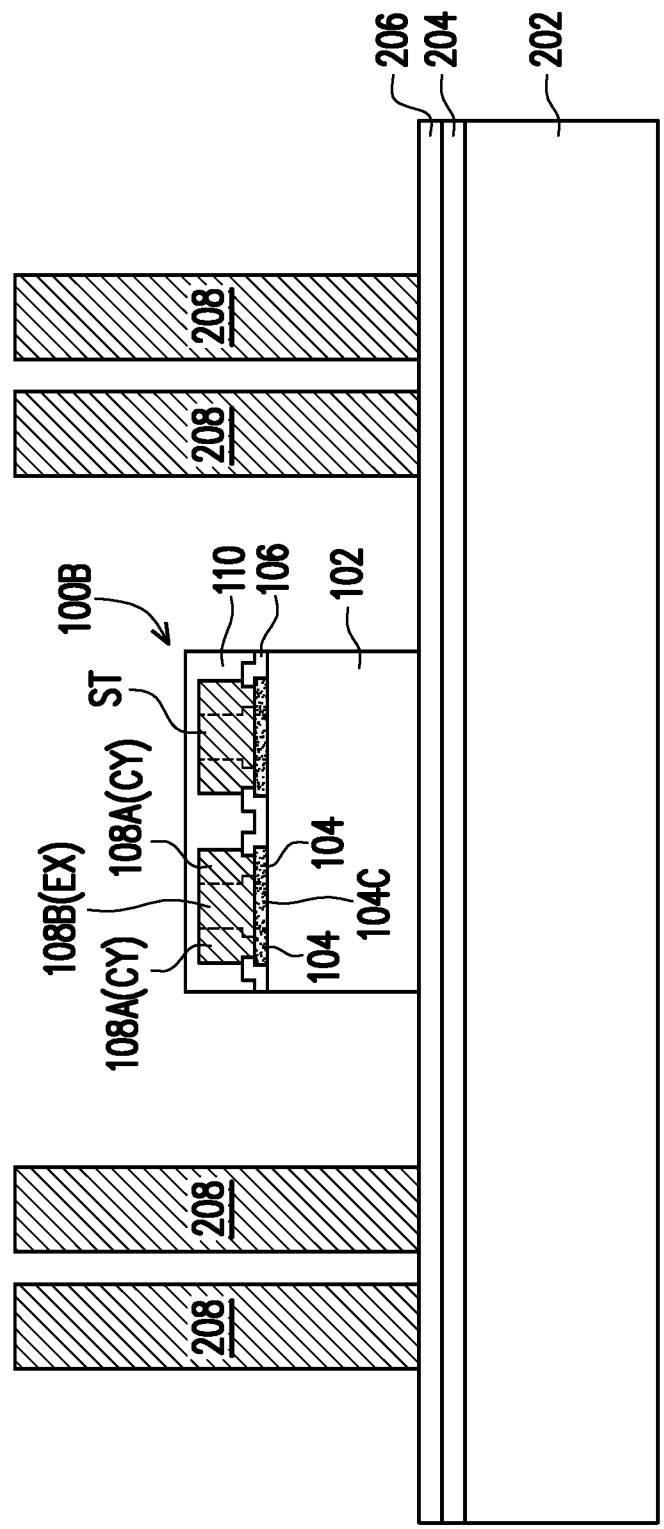
FIG. 17 to FIG. 24 are schematic cross-sectional views of various stages in a manufacturing method of a package structure according to some exemplary embodiments of the present disclosure.

FIG. 17 to FIG. 24 are schematic cross-sectional views of various stages in a manufacturing method of a package structure according to some exemplary embodiments of the present disclosure. Referring to FIG. 17, after forming the semiconductor dies (100A/100B), a carrier 202 having a de-bonding layer 204 and a dielectric layer 206 formed thereon is provided. The de-bonding layer 204 is located between the carrier 202 and the dielectric layer 206. In some embodiments, the carrier substrate 202 may be a glass substrate, the de-bonding layer 204 may be a light-to-heat conversion (LTHC) release layer formed on the glass substrate, and the dielectric layer 206 may be a polybenzoxazole (PBO) layer formed on the de-bonding layer 204.

After providing the carrier 202, a plurality of through insulator vias 208 is formed on the dielectric layer 206 and over the carrier 202. In some embodiments, the through insulator vias 208 are through integrated fan-out ("InFO") vias. In one embodiment, the formation of the through insulator vias 208 includes forming a mask pattern (not shown) with openings, then forming a metallic material (not shown) filling up the openings by electroplating or deposition, and removing the mask pattern to form the through insulator vias 208 on the carrier 202. In one embodiment, the material of the through insulator vias 208 may include a metal material such as copper or copper alloys, or the like. However, the disclosure is not limited thereto. In an alternative embodiment, the through insulator vias 208 may be formed by forming a seed layer (not shown) on the dielectric layer 206; forming the mask pattern with openings exposing portions of the seed layer; forming the metallic material on the exposed portions of the seed layer to form the through insulator vias 208 by plating; removing the mask pattern; and then removing portions of the seed layer exposed by the through insulator vias 208. For example, the seed layer may be a titanium/copper composited layer.

Furthermore, as illustrated in FIG. 17, one or more semiconductor dies 100B (formed in FIG. 10) may be picked and placed on the dielectric layer 206. The semiconductor die 100B is attached or adhered on the dielectric layer 206 through a die attach film (DAF), an adhesion paste or the like. In some embodiments, the semiconductor dies 100B placed on the dielectric layer 206 may be arranged in an array, and when the semiconductor dies 100B are arranged in an array, the through insulator vias 208 may be classified into groups. The number of the semiconductor dies 100B may correspond to the number of the groups of the through insulator vias 208. In the illustrated embodiment, the semiconductor die 100B may be picked and placed on the dielectric layer 206 after the formation of the through insulator vias 208. However, the disclosure is not limited thereto. In some alternative embodiments, the semiconductor dies 100B may be picked and placed on the dielectric layer 206 before the formation of the through insulator vias 208.

Figure 18:
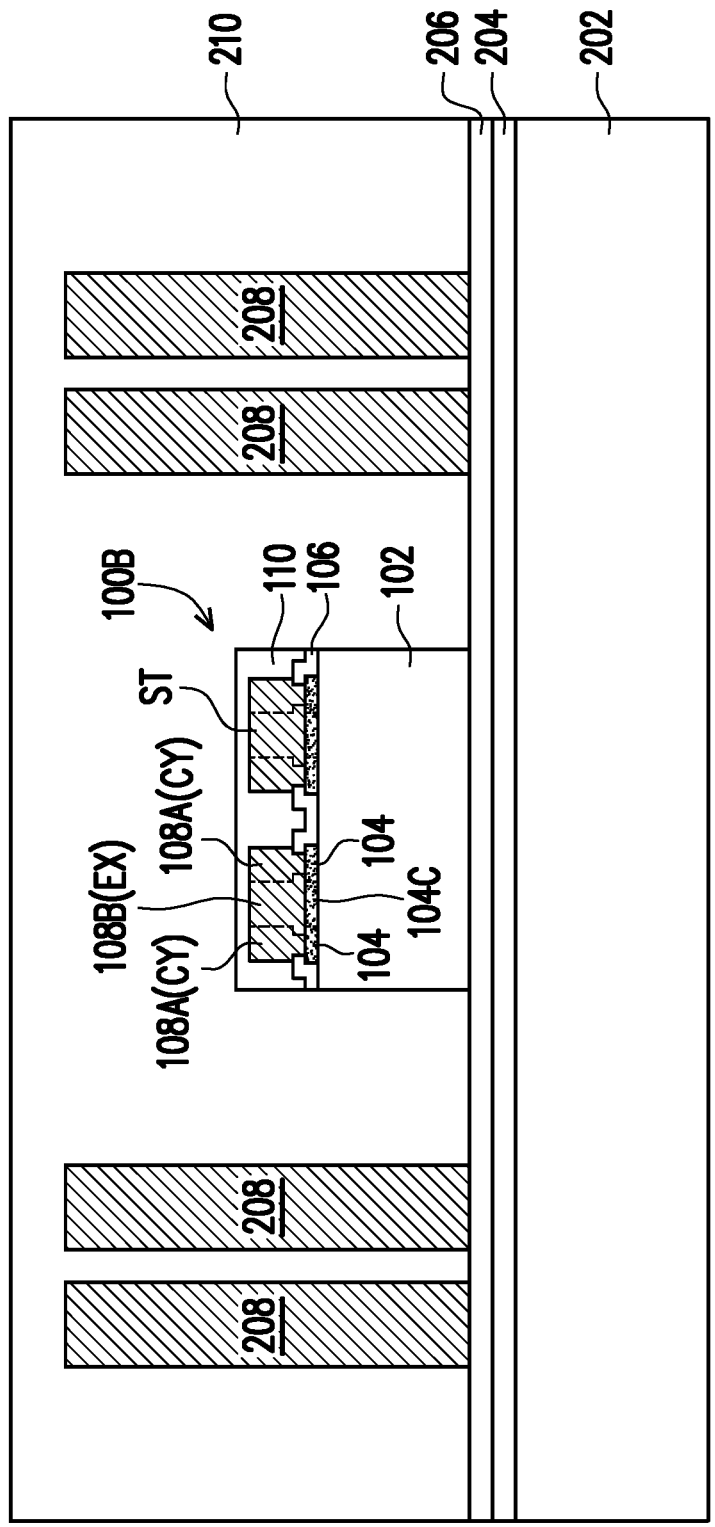

Referring to FIG. 18, an insulating material 210 is formed on the dielectric layer 206 and over the semiconductor die 100B. In some embodiments, the insulating material 210 is formed through, for example, a compression molding process, filling up the gaps between the semiconductor die 100B and the through insulator vias 208, and encapsulating the semiconductor die 100B. The insulating material 210 also fills up the gaps between adjacent through insulator vias 208 to encapsulate the through insulator vias 208. The conductive strips ST and the protection layer 110 of the semiconductor die 100B are encapsulated by and well protected by the insulating material 210. In other words, the conductive strips ST and the protection layer 110 of the semiconductor die 100B are not revealed by the insulating material 210.

In some embodiments, the insulating material 210 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 210 may include an acceptable insulating encapsulation material. In some embodiments, the insulating material 210 may further include inorganic filler or inorganic compound (e.g. silica, clay, and so on) which can be added therein to optimize coefficient of thermal expansion (CTE) of the insulating material 210. The disclosure is not limited thereto.

Figure 19:
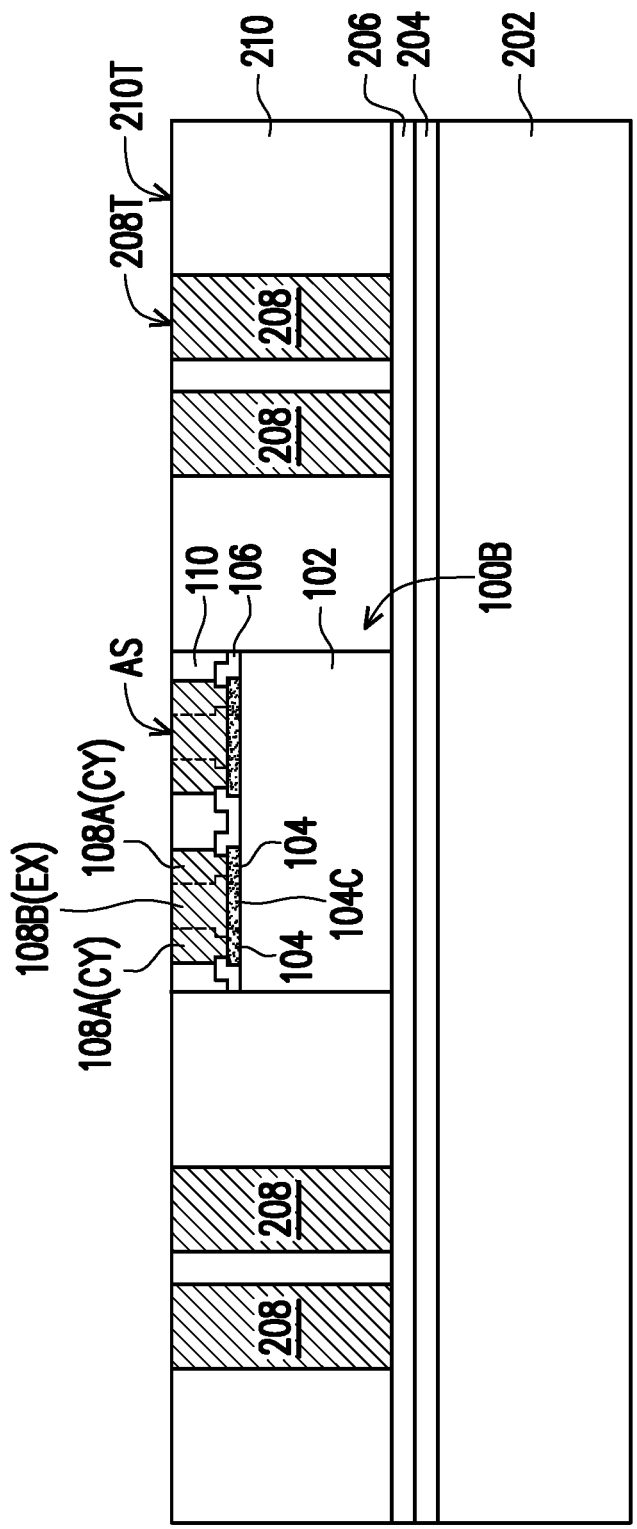

Referring to FIG. 19, in some embodiments, the insulating material 210 is partially removed to expose the conductive strips ST and the through insulator vias 208. In some embodiments, the insulating material 210 and the protection layer 110 are ground or polished by a planarization step. For example, the planarization step is performed through a mechanical grinding process and/or a chemical mechanical polishing (CMP) process until the top surfaces (or active surface AS) of the conductive strips ST are revealed. In some embodiments, the through insulator vias 208 may be partially polished so that the top surfaces 208T of the through insulator vias 104 are levelled with the top surfaces (or active surface AS) of the conductive strips ST. In other words, the conductive strips ST and the through insulator vias 208 may also be slightly grinded/polished.

In the illustrated embodiment, the insulating material 210 is polished to form an insulating encapsulant 210'. In some embodiments, the top surface 210T of the insulating encapsulant 210', the top surface 208T of the through insulator vias 208, the top surface (active surface AS) of the conductive strips ST, and the top surface of the polished protection layer 110 are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 20:
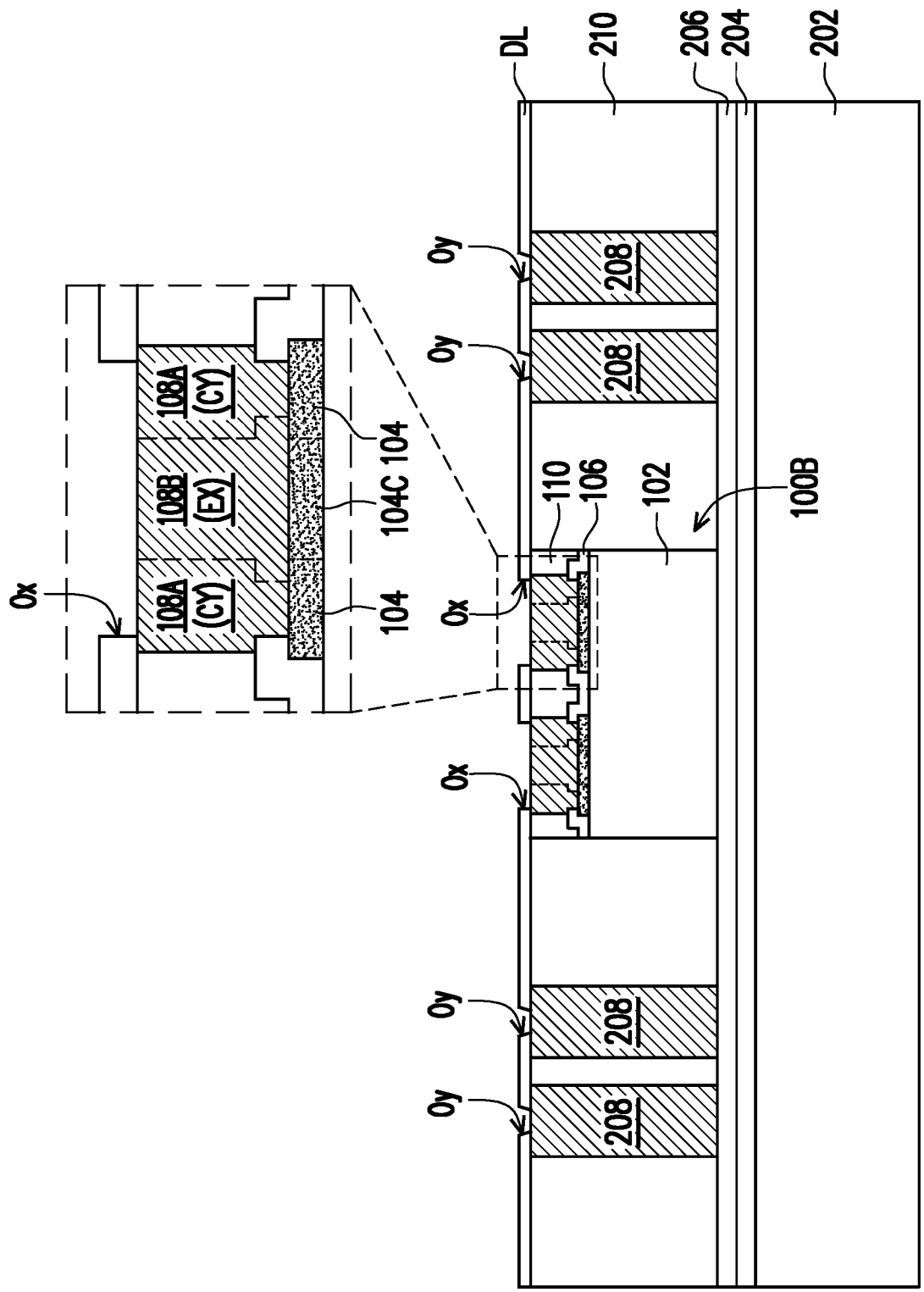

Referring to FIG. 20, after the planarization step, a step of forming a redistribution layer on the insulating encapsulant 210' and the semiconductor die 100B is performed. As illustrated in FIG. 20, in a first step of forming the redistribution layer, a dielectric layer DL is formed on the insulating encapsulant 210' and the semiconductor die 100B. The dielectric layer DL is patterned to form openings Ox that exposes the conductive strips ST, and openings Oy that exposes the through insulator vias 208. In some embodiments, each of the openings Ox exposes the plurality of conductive posts 108A and the first connecting structure 108B. In certain embodiments, an outline of the opening Ox of the dielectric layer DL may substantially correspond to an outline of the contact opening OP of the passivation layer 106.

In certain embodiments, the material of the dielectric layer DL may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layer DL is formed by suitable fabrication techniques such as spin-on coating, chemical vapor deposition (CVD), plasma-enhanced chemical vapor deposition (PECVD) or the like. The disclosure is not limited thereto.

Figure 21:
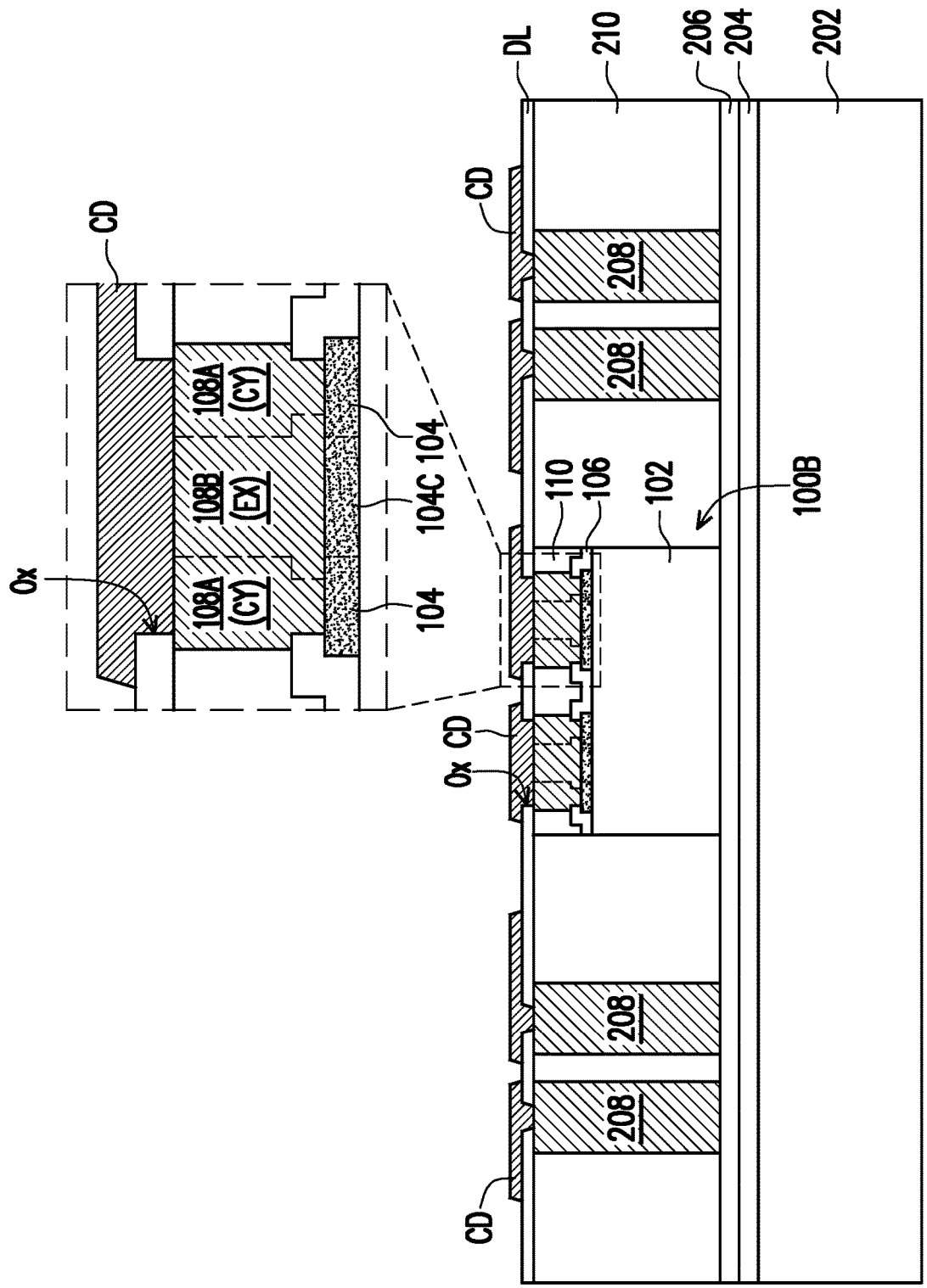

Referring to FIG. 21, in a next step of forming the redistribution layer, a conductive layer CD is formed within the opening Ox, wherein the conductive layer CD is physically connected to the plurality of conductive posts 108A and the first connecting structure 108B through the openings Ox. Furthermore, the conductive layer CD is physically connected to the plurality of through insulator vias 208 through the openings Oy. In some embodiments, the material of the conductive layer CD may be any conductive materials formed by electroplating or deposition, such as aluminum, titanium, copper, nickel, tungsten, and/or alloys thereof, which may be patterned using a photolithography and etching process. In some embodiments, the conductive layer CD may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 22:
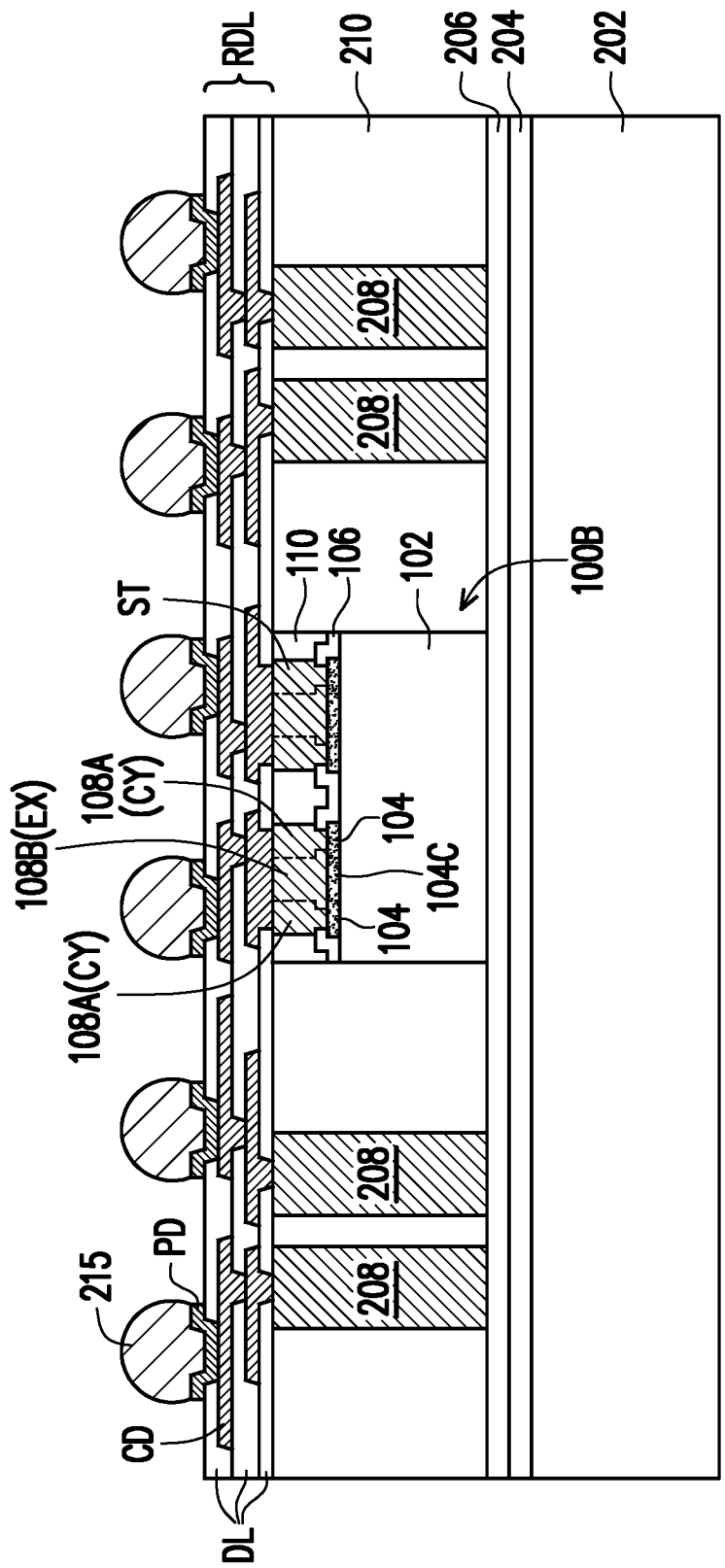

Referring to FIG. 22, the steps shown in FIG. 20 and FIG. 21 may be repeated to form a redistribution layer RDL having a plurality of dielectric layers DL and a plurality of conductive layers CD alternately stacked. Although only two layers of the conductive layers CD and three layers of dielectric layers DL are illustrated herein, however, the scope of the disclose is not limited by the embodiments of the disclosure. In other embodiments, the number of dielectric layers DL and conductive layers CD may be adjusted based on product requirement. After forming the redistribution layer RDL, a plurality of conductive pads PD may be disposed on an exposed top surface of the topmost layer of the conductive layers CD for electrically connecting with conductive terminals (or conductive balls).

In certain embodiments, the conductive pads PD are for example, under-ball metallurgy (UBM) patterns used for ball mount. As shown in FIG. 22, the conductive pads PD are formed on and electrically connected to the redistribution layer RDL. In some embodiments, the materials of the conductive pads PD may include copper, nickel, titanium, tungsten, or alloys thereof or the like, and may be formed by an electroplating process, for example. The number of conductive pads PD are not limited in this disclosure, and may be selected based on the design layout. In some alternative embodiments, the conductive pads PD may be omitted. In other words, conductive terminals 215 formed in subsequent steps may be directly disposed on the redistribution layer RDL.

As illustrated in FIG. 22, after forming the conductive pads PD, a plurality of conductive terminals 215 is disposed on the conductive pads PD and over the redistribution layer RDL. In some embodiments, the conductive terminals 215 may be formed on the conductive pads PD by a ball placement process or reflow process. In some embodiments, the conductive terminals 215 are, for example, solder balls or ball grid array (BGA) balls. In certain embodiments, some of the conductive terminals 215 may be electrically connected to the semiconductor die 100B through the redistribution layer RDL. Furthermore, some of the conductive terminals 215 may be electrically connected to the through insulator vias 208 through the redistribution layer RDL. The number of the conductive terminals 215 is not limited to the disclosure, and may be designated and selected based on the number of the conductive pads PD.

Figure 23:
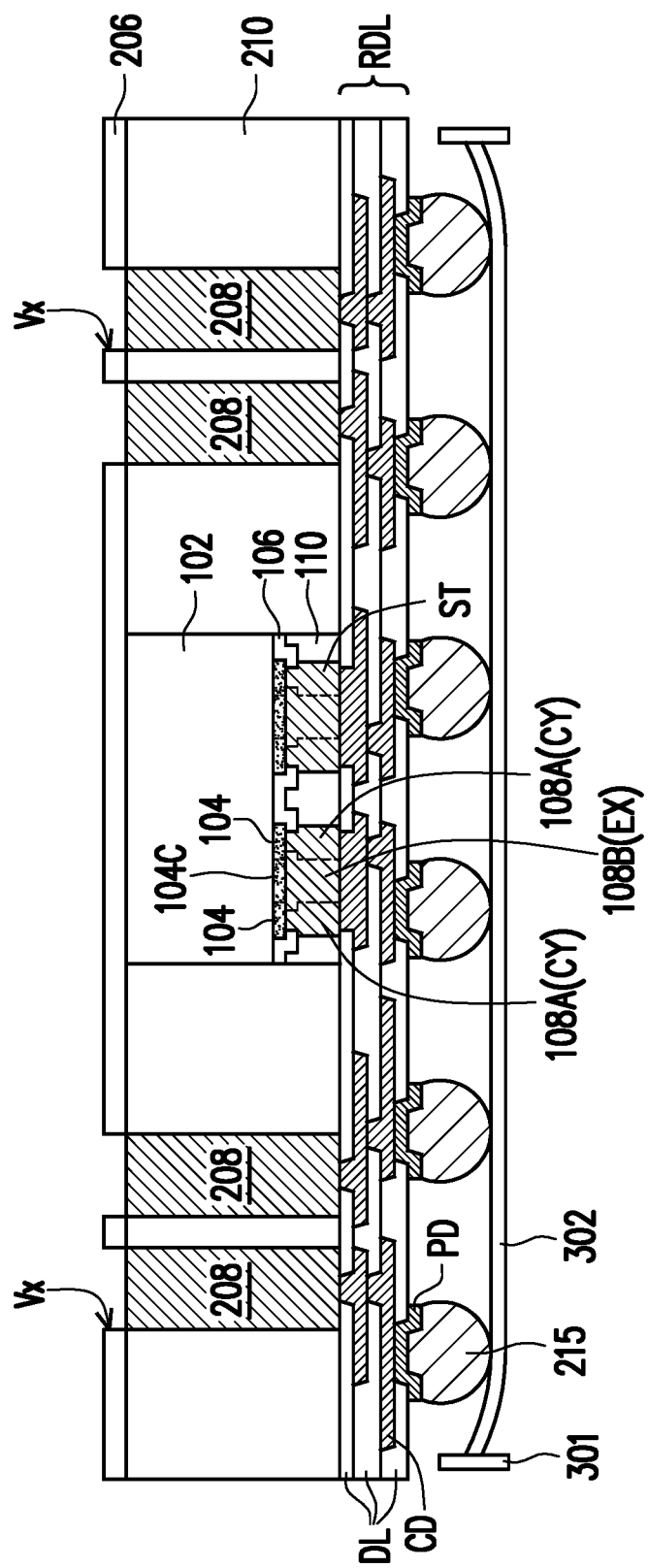

Referring to FIG. 23, in some embodiments, after forming the redistribution layer RDL and the conductive terminals 215, the structure shown in FIG. 22 may be turned upside down and attached to a tape 302 supported by a frame 301. Subsequently, the carrier 202 may be de-bonded so as to separate the semiconductor die 100B and the through insulator vias 208 from the carrier 202. In the exemplary embodiment, the de-bonding process includes projecting a light such as a laser light or an UV light on the de-bonding layer 204 (e.g., the LTHC release layer), such that the carrier 202 can be easily removed. In certain embodiments, the de-bonding layer 204 may be further removed or peeled off so that de-bonding layer 204 is separated from the dielectric layer 206. As shown in FIG. 23, the dielectric layer 206 is then patterned such that a plurality of contact openings Vx is formed to expose the bottom surfaces of the through insulator vias 208. The number of the contact openings Vx is corresponding to the number of the through insulator vias 208.

Figure 24:
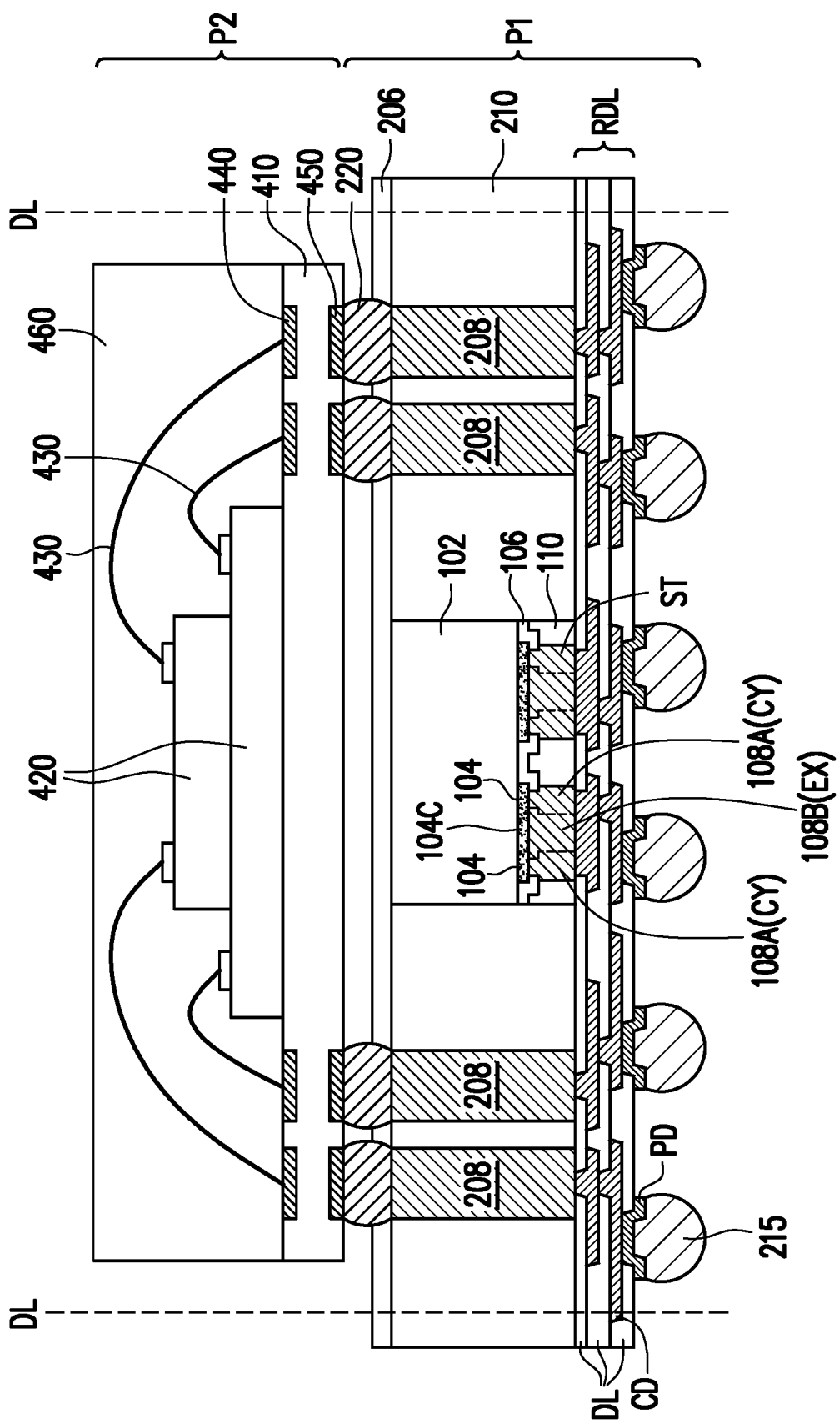

Referring to FIG. 24, after the contact openings Vx are formed in the dielectric layer 206, a plurality of conductive balls 220 are placed on the bottom surfaces of the through insulator vias 208 exposed by the contact openings Vx. The conductive balls 220 are, for example, reflowed to bond with the bottom surfaces of the through insulator vias 208. As shown in FIG. 24, after the conductive balls 220 and the conductive terminals 215 are formed, a first package P1 having dual-side terminals is accomplished.

In some embodiments, after forming the first package P1, a second package P2 is provided and stacked on the first package P1. For example, the second package P2 is electrically connected to the plurality of conductive balls 220 of the first package P1. In the exemplary embodiment, the second package P2 has a substrate 410, a plurality of semiconductor chips 420 mounted on one surface (e.g. top surface) of the substrate 410 and stacked on top of one another. In some embodiments, bonding wires 430 are used to provide electrical connections between the semiconductor chips 420 and pads 440 (such as bonding pads). In some embodiments, an insulating encapsulant 460 is formed to encapsulate the semiconductor chips 420 and the bonding wires 430 to protect these components. In some embodiments, through insulator vias (not shown) may be used to provide electrical connection between the pads 440 and conductive pads 450 (such as bonding pads) that are located on another surface (e.g. bottom surface) of the substrate 410. In certain embodiments, the conductive pads 450 are electrically connected to the semiconductor chips 420 through these through insulator vias (not shown). In some embodiments, the conductive pads 450 of the second package P2 are electrically connected to the conductive balls 220 of the first package P1. After stacking the second package P2 on the first package P1 and providing electrical connection therebetween, a package-on-package structure can be fabricated. In some embodiments, a dicing process may be performed at the dicing line DL to cut the whole package structure into individual packages.

Figure 25:
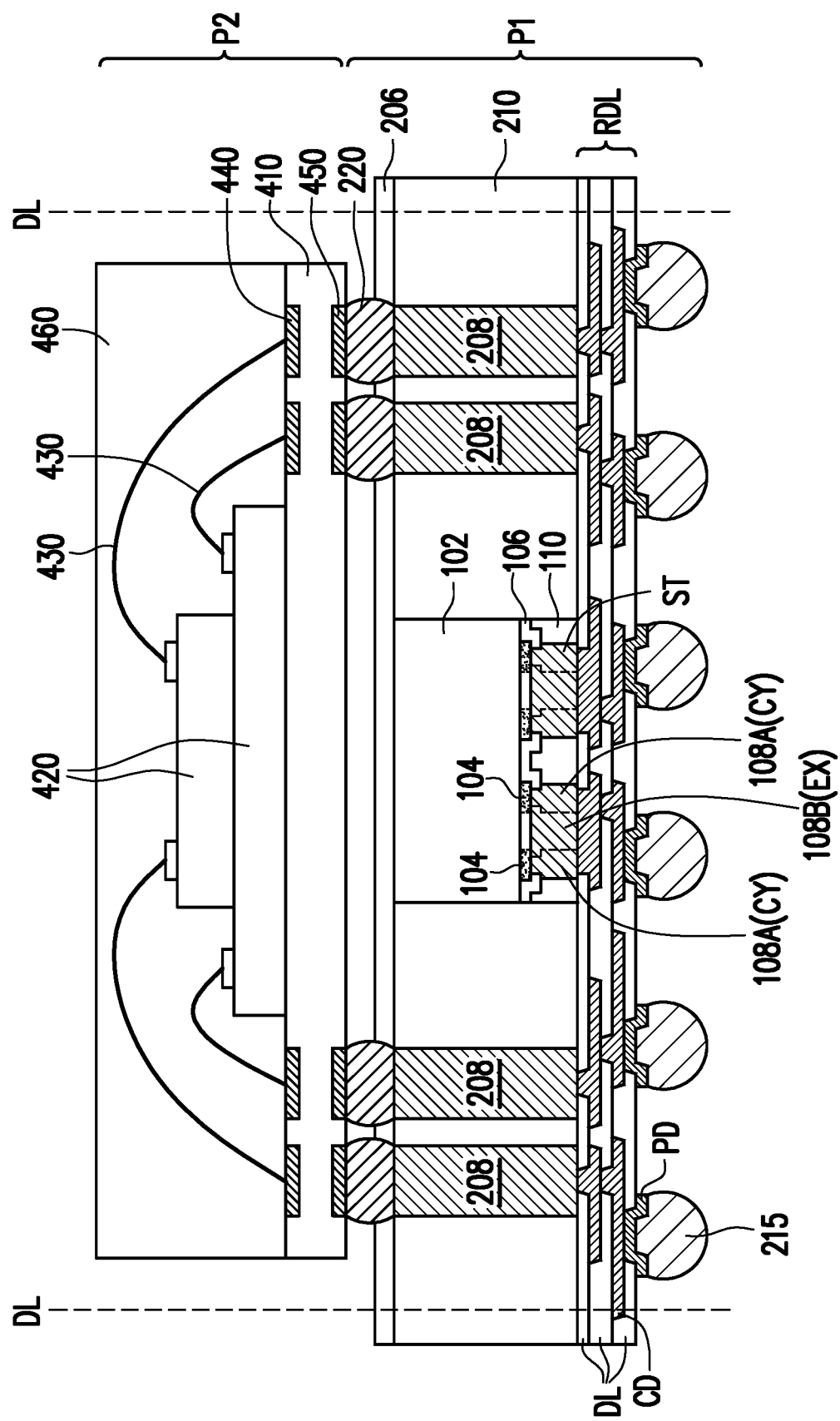
FIG. 25 is a schematic cross-sectional view of a package structure according to another exemplary embodiment of the present disclosure.

FIG. 25 is a schematic cross-sectional view of a package structure according to another exemplary embodiment of the present disclosure. The embodiment shown in FIG. 25 is similar to the embodiment shown in FIG. 24, hence the same reference numerals are used to refer to the same or liked parts, and its detailed description will not be repeated herein. The difference between the embodiments of FIG. 24 and FIG. 25 is that the semiconductor die 100A (formed in FIG. 5) is used instead of the semiconductor die 100B. In other words, the semiconductor die 100A do not have a second connecting structure (104C), and the conductive strips ST are physically connected to the conductive pads 104 located below.

In the above embodiments, the conductive posts of the semiconductor die are connected together by first connecting structures. Furthermore, the redistribution layer is physically connected to the conductive posts and the first connecting structures. As such, a heat relax capability of the semiconductor die may be improved, and heat transfer from the semiconductor die to the redistribution layer becomes more efficient. Overall, the power integrity and performance of the package structure can be enhanced.

In some embodiments of the present disclosure, a package structure including a semiconductor die, an insulating encapsulant, a redistribution layer and a plurality of conductive terminals is provided. The semiconductor die includes a semiconductor substrate, a plurality of conductive pads and a plurality of conductive strips. The conductive pads are disposed on and connected to the plurality of conductive pads, wherein each of the conductive strips is physically connected to at least two conductive pads. The insulating encapsulant is encapsulating the semiconductor die. The redistribution layer is disposed on the insulating encapsulant and the semiconductor die, wherein the redistribution layer is electrically connected to the plurality of conductive strips. The plurality of conductive terminals is disposed on the redistribution layer.

In another embodiment of the present disclosure, a package structure including a semiconductor die, an insulating encapsulant, a redistribution layer and a plurality of conductive terminals is provided. The semiconductor die includes a semiconductor substrate, a plurality of conductive pads, a plurality of conductive posts, and a first connecting structure. The plurality of conductive pads is disposed on the semiconductor substrate. The plurality of conductive posts is disposed on and connected to the plurality of conductive pads. The first connecting structure physically connects at least two of the conductive posts together. The insulating encapsulant is encapsulating the semiconductor die. The redistribution layer is disposed on the insulating encapsulant and the semiconductor die, wherein the redistribution layer is electrically connected to the plurality of conductive posts and the plurality of first connecting structures. The plurality of conductive terminals is disposed on the redistribution layer.

In yet another embodiment of the present disclosure, a method of fabricating a package structure is described. The method includes the following steps. A semiconductor die is formed through the following steps. A semiconductor wafer having a semiconductor substrate is provided. A first conductive material is formed on the semiconductor substrate. The first conductive material is patterned to form a plurality of conductive pads. A passivation layer is formed over the plurality of conductive pads, and the passivation layer is patterned to form at least one contact opening exposing the plurality of conductive pads. A plurality of conductive strips is formed within the contact opening and on the plurality of conductive pads, wherein each of the conductive strips is formed with a plurality of conductive posts and a first connecting structure joining the plurality of conductive posts together. A wafer dicing process is performed to cut the semiconductor wafer into a plurality of semiconductor dies. The semiconductor die is disposed on a carrier. An insulating encapsulant is formed on the carrier to encapsulate the semiconductor die. A redistribution layer is formed on the insulating encapsulant and the semiconductor die. A plurality of conductive terminals is formed on the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a semiconductor die, the semiconductor die comprising:
a semiconductor substrate;
a plurality of conductive pads disposed on the semiconductor substrate;
a plurality of conductive strips disposed on and connected to the plurality of conductive pads, wherein each of the plurality of conductive strips has a plurality of conductive posts and a first connecting structure physically connecting the plurality of conductive posts together, and the first connecting structure is physically connected to at least two conductive pads;
a protection layer surrounding the plurality of conductive strips, wherein a top surface of the protection layer is coplanar with a top surface of the plurality of conductive posts and a top surface of the first connecting structure;
an insulating encapsulant encapsulating the semiconductor die, wherein a top surface of the insulating encapsulant is coplanar with the top surface of the protection layer, the top surface of the plurality of conductive posts and the top surface of the first connecting structure;
a redistribution layer disposed on the top surface of the insulating encapsulant and the semiconductor die and having sidewalls that are aligned with the insulating encapsulant, wherein the redistribution layer comprises:
a first dielectric layer having at least one opening, wherein the first dielectric layer partially covers the plurality of conductive posts, and the at least one opening partially exposes the plurality of conductive strips;
a first conductive layer disposed on the first dielectric layer and filling up the at least one opening, wherein the first conductive layer is physically and electrically connected to the plurality of conductive posts and the first connecting structure of the plurality of conductive strips through the at least one opening; and
a second dielectric layer and a second conductive layer alternately stacked over the first dielectric layer and the first conductive layer, wherein the second conductive layer is electrically connected to the first conductive layer; and
a plurality of conductive terminals disposed on the redistribution layer and directly attached to the redistribution layer through a plurality of conductive pads.

2. The package structure according to claim 1, wherein a height of the first connecting structure is equal to a height of the plurality of conductive posts.

3. The package structure according to claim 1, wherein the semiconductor die further comprises:
a second connecting structure located in between the plurality of conductive strips and the semiconductor substrate, wherein the second connecting structure physically connects at least two of the plurality of conductive pads together.

4. The package structure according to claim 3, wherein a thickness of the second connecting structure is equal to a thickness of the plurality of conductive pads.

5. The package structure according to claim 3, wherein the semiconductor die further comprises:
a passivation layer disposed on the plurality of conductive pads, wherein the passivation layer has at least one contact opening, and the contact opening exposes the plurality of contact pads and the second connecting structure, and
the plurality of conductive strips is connected to the plurality of conductive pads and the second connecting structure through the contact opening.

6. A package structure, comprising:
a semiconductor die, the semiconductor die comprising:
a semiconductor substrate;
a plurality of conductive pads disposed on the semiconductor substrate;
a passivation layer disposed on the plurality of conductive pads, wherein the passivation layer has at least one contact opening that exposes the plurality of conductive pads;
a plurality of conductive posts disposed on and physically connected to each of the plurality of conductive pads through the at least one contact opening;
a first connecting structure physically connects at least two of the plurality of conductive posts together, and is physically connected to at least two of the plurality of conductive pads through the at least one contact opening;
an insulating encapsulant encapsulating the semiconductor die;
a redistribution layer disposed on the insulating encapsulant and the semiconductor die, wherein the redistribution layer comprises:
a dielectric layer having at least one opening, the dielectric layer partially covers the plurality of conductive posts, and the at least one opening partially exposes the plurality of conductive strips, wherein an outline of the at least one opening of the dielectric layer substantially correspond to an outline of the at least one contact opening of the passivation layer;
a conductive layer disposed on the dielectric layer and filling up the at least one opening, wherein the conductive layer is physically and electrically connected to the plurality of conductive posts and the first connecting structure through the at least one opening; and
a plurality of conductive terminals disposed on the redistribution layer.

7. The package structure according to claim 6, wherein a height of the first connecting structure is equal to a height of the plurality of conductive posts.

8. The package structure according to claim 6, wherein the first connecting structure physically connects all of the plurality of conductive posts together.

9. The package structure according to claim 6, wherein the semiconductor die further comprises:
a plurality of dummy pads disposed on the semiconductor substrate adjacent to the plurality of conductive pads, wherein the plurality of dummy pads is not connected to the plurality of conductive posts and the first connecting structure.

10. The package structure according to claim 6, wherein the semiconductor die further comprises:
a second connecting structure located in between the first connecting structure and the semiconductor substrate, wherein the second connecting structure physically connects at least two of the plurality of conductive pads together.

11. The package structure according to claim 10, wherein the second connecting structure physically connects all of the plurality of conductive pads together.

12. The package structure according to claim 10, wherein a thickness of the second connecting structure is equal to a thickness of the plurality of conductive pads.

13. The package structure according to claim 10, wherein the first connecting structure is connected to the second connecting structure.

14. A method of fabricating a package structure, comprising:
forming a semiconductor die, wherein a method of forming the semiconductor die comprises:
providing a semiconductor wafer having a semiconductor substrate;
forming a first conductive material on the semiconductor substrate;
pattering the first conductive material to form a plurality of conductive pads;
forming a passivation layer over the plurality of conductive pads, and patterning the passivation layer to form at least one contact opening exposing the plurality of conductive pads;
forming a plurality of conductive strips within the contact opening and on the plurality of conductive pads, wherein each of the plurality of conductive strips is formed with a plurality of conductive posts and a first connecting structure physically joining at least two of the plurality of conductive posts together, and the first connecting structures is physically connected to at least two of the plurality of conductive pads;
forming a protection layer surrounding the plurality of conductive strips;
performing a wafer dicing process to cut the semiconductor wafer into a plurality of semiconductor dies;
disposing at least one of the plurality of semiconductor dies on a carrier;
forming an insulating encapsulant on the carrier and encapsulating the at least one of the plurality of semiconductor dies;
performing a planarization step to remove portions of the protection layer and portions of the insulating encapsulant, so that a top surface of the insulating encapsulant is coplanar with a top surface of the protection, a top surface of the plurality of conductive posts and a top surface of the first connecting structure;
forming a redistribution layer on the insulating encapsulant and the at least one of the plurality of semiconductor dies, wherein a method of forming the redistribution layer comprises:
forming a first dielectric layer on the insulating encapsulant and the semiconductor die;
patterning the first dielectric layer to form at least one opening, wherein the first dielectric layer partially covers the plurality of conductive posts, and the at least one opening partially exposes the plurality of conductive strips;
forming a first conductive layer on the first dielectric layer and filling up the at least one opening, wherein the first conductive layer is physically and electrically connected to the plurality of conductive posts and the plurality of first connecting structures through the at least one opening; and
forming a second dielectric layer and a second conductive layer alternately stacked over the first dielectric layer and the first conductive layer, wherein the second conductive layer is electrically connected to the first conductive layer; and
forming a plurality of conductive terminals on the redistribution layer, wherein the plurality of conductive terminals is directly attached to the redistribution layer through a plurality of conductive pads.

15. The method of fabricating the package structure according to claim 14, wherein the first conductive material is patterned to form the plurality of conductive pads and a second connecting structure connecting at least two of the plurality of conductive pads together, and the at least one contact opening exposes the plurality of conducive pads and the second connecting structure.

16. The method of fabricating the package structure according to claim 14, wherein the first conductive material is patterned to form the plurality of conductive pads and a plurality of dummy pads, wherein the plurality of conductive strips is physically connected to the plurality of conductive pads, and not connected to the plurality of dummy pads.

17. The package structure according to claim 1, wherein the semiconductor die further comprises:
a plurality of dummy pads disposed on the semiconductor substrate adjacent to the plurality of conductive pads, wherein the plurality of dummy pads is not connected to the plurality of conductive posts and the first connecting structure.

18. The package structure according to claim 1, wherein the first conductive layer extends from a position overlapped with the semiconductor die towards a position away from and non-overlapped with the semiconductor die.

19. The package structure according to claim 1, further comprising through insulator vias embedded in the insulating encapsulant and surrounding the semiconductor die, wherein the first dielectric layer of the redistribution layer has a second opening that partially exposes the through insulator vias, and the first conductive layer is electrically connected to the through insulator vias through the second opening.

20. The package structure according to claim 6, further comprising through insulator vias embedded in the insulating encapsulant and surrounding the semiconductor die, wherein the dielectric layer of the redistribution layer has a second opening that partially exposes the through insulator vias, and the conductive layer is electrically connected to the through insulator vias through the second opening.

* * * * *